United States Patent
Yanai et al.

(10) Patent No.: US 8,951,844 B2
(45) Date of Patent: Feb. 10, 2015

(54) METHOD OF PRODUCING A SEMICONDUCTOR DEVICE INCLUDING TREATMENT WITH DILUTE HYDROFLUORIC ACID

(75) Inventors: Naomi Yanai, Kuwana (JP); Yuka Kase, Kuwana (JP); Hiroyuki Ogawa, Nagoya (JP)

(73) Assignee: Fujitsu Semiconductor Limited, Yokohama (JP)

( * ) Notice: Subject to any disclaimer, the term of this patent is extended or adjusted under 35 U.S.C. 154(b) by 341 days.

(21) Appl. No.: 13/440,262

(22) Filed: Apr. 5, 2012

(65) Prior Publication Data
US 2012/0322226 A1 Dec. 20, 2012

(30) Foreign Application Priority Data
Jun. 17, 2011 (JP) .................. 2011-135617

(51) Int. Cl.
- H01L 21/00 (2006.01)
- H01L 21/02 (2006.01)
- H01L 21/311 (2006.01)
- H01L 21/67 (2006.01)
- H01L 21/762 (2006.01)
- H01L 27/115 (2006.01)

(52) U.S. Cl.
CPC .... H01L 21/02057 (2013.01); H01L 21/31111 (2013.01); H01L 21/67028 (2013.01); H01L 21/67057 (2013.01); H01L 21/76224 (2013.01); H01L 27/11546 (2013.01); Y10S 438/963 (2013.01)

USPC .......................................... 438/115; 438/963

(58) Field of Classification Search
CPC ..................... H01L 21/67057; H01L 21/6704; H01L 21/02052; H01L 21/67023
USPC ......... 438/149, 311, 458, 400, 404, 318, 905, 438/906, 963, 115
See application file for complete search history.

(56) References Cited

U.S. PATENT DOCUMENTS

| | | | | |
|---|---|---|---|---|
| 5,940,985 | A | * | 8/1999 | Kamikawa et al. ............. 34/471 |
| 8,313,989 | B2 | * | 11/2012 | Ohnuma et al. ............... 438/149 |
| 2009/0102010 | A1 | * | 4/2009 | Ema et al. ...................... 257/506 |

FOREIGN PATENT DOCUMENTS

JP 2001-053050 A 2/2001

* cited by examiner

Primary Examiner — Thanh Y Tran
(74) Attorney, Agent, or Firm — Westerman, Hattori, Daniels & Adrian, LLP

(57) ABSTRACT

A semiconductor device production method includes: treating a wafer which contains a silicon substrate with dilute hydrofluoric acid in a bath; introducing water into the bath while discharging the dilute hydrofluoric acid from the bath; and introducing $H_2O_2$ and warm water warmer than the above-mentioned water into the bath after the discharge of dilute hydrofluoric acid from the bath in such a manner that the introduction of warm water is started simultaneously with the start of $H_2O_2$ supply or subsequently to the start of $H_2O_2$ supply.

17 Claims, 34 Drawing Sheets

FIG. 1

| Treatment | Composition | Temperature | Purpose | Note |
|---|---|---|---|---|
| DHF | $H_2O+HF$ | Room temperature or above | Removal of oxide film Removal of metal | Impossible to remove metal with high redox potential |
| APM | $H_2O+H_2O_2+NH_4OH$ | About 40°C to 80°C | Removal of particles | High temperature treatment for improving removal performance |
| HPM | $H_2O+H_2O_2+HCl$ | About 60°C to 80°C | Removal of metal | High temperature treatment for improving removal performance |

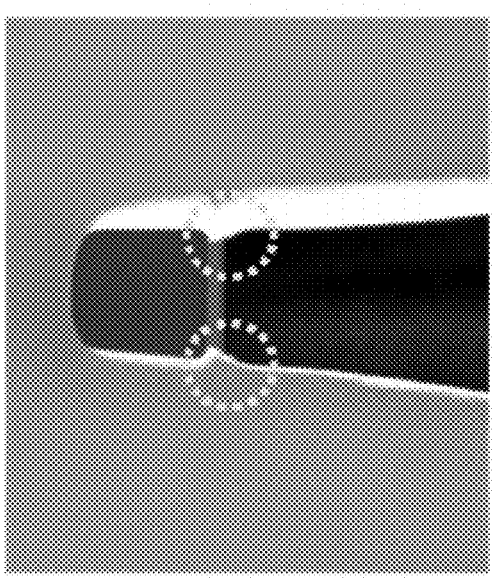
FIG. 4A BEFORE TREATMENT
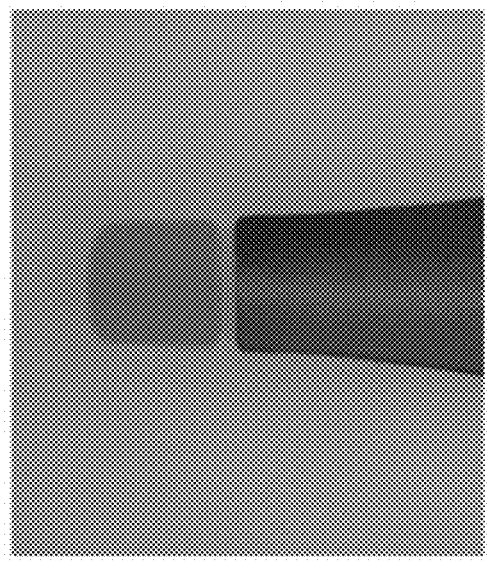
FIG. 4B APM + DHF
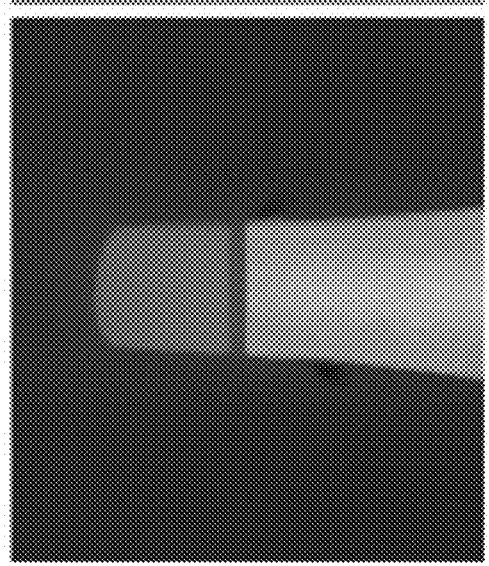
FIG. 4C APM + DHF + HPM

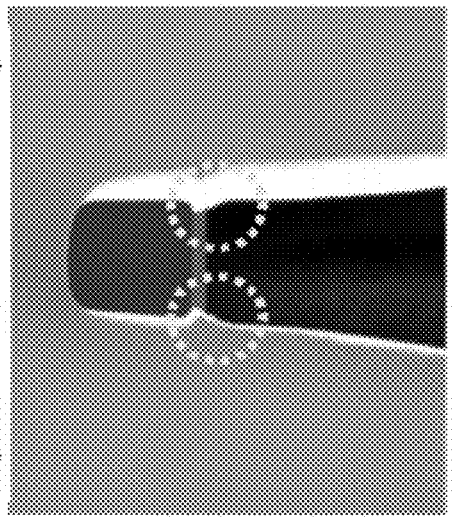
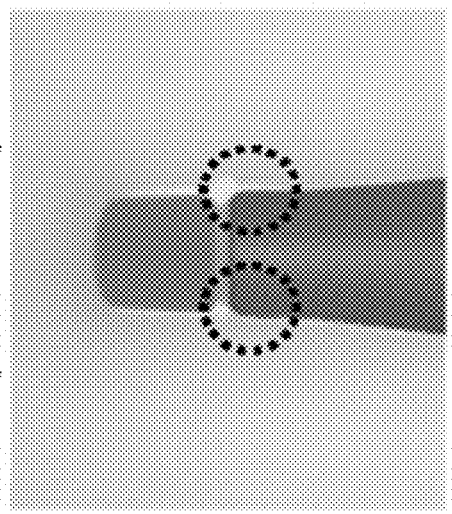
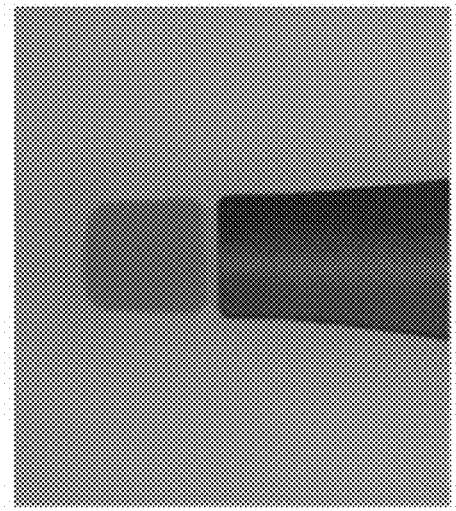
FIG. 6A  APM + DHF
FIG. 6B  APM + DHF + HPM (EMBODIMENT)
FIG. 6C  APM + DHF + HPM (COMPARATIVE EXAMPLE)

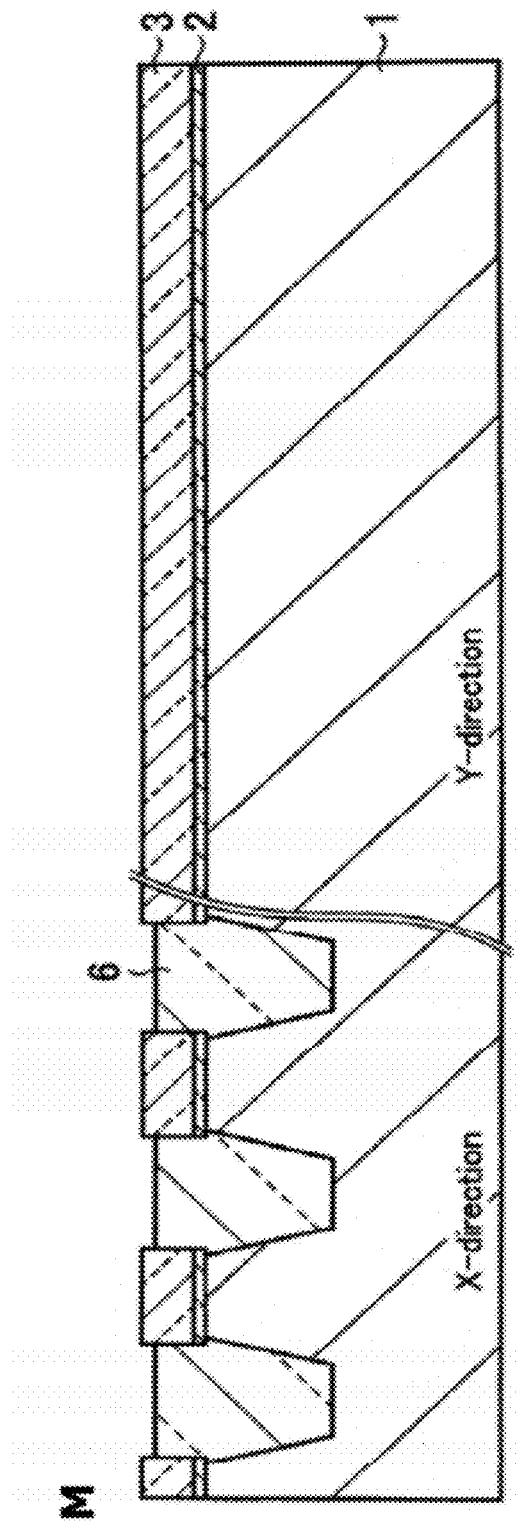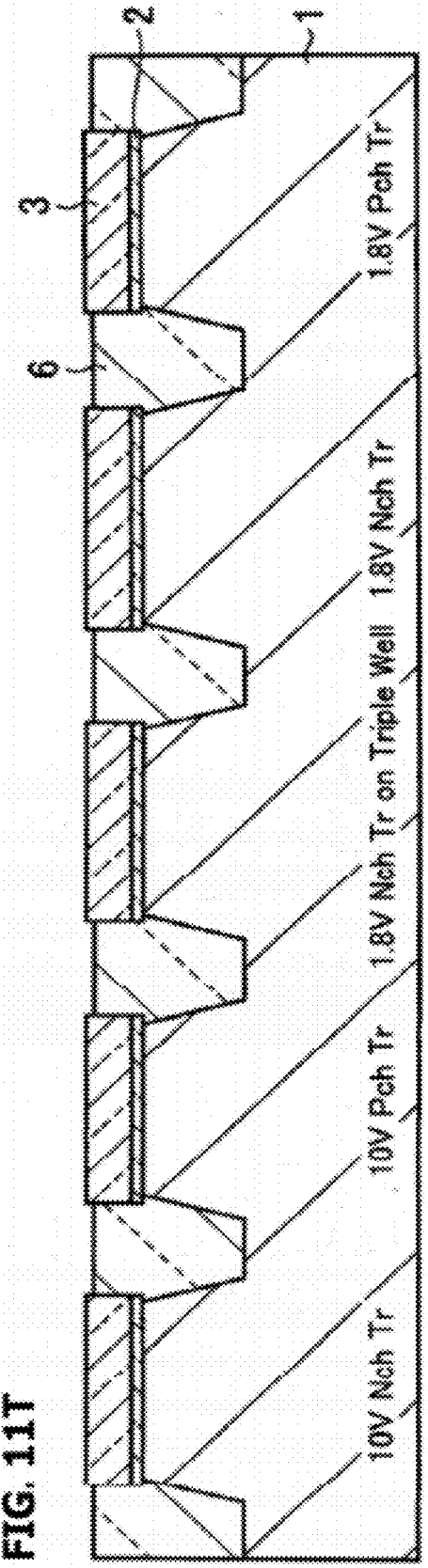

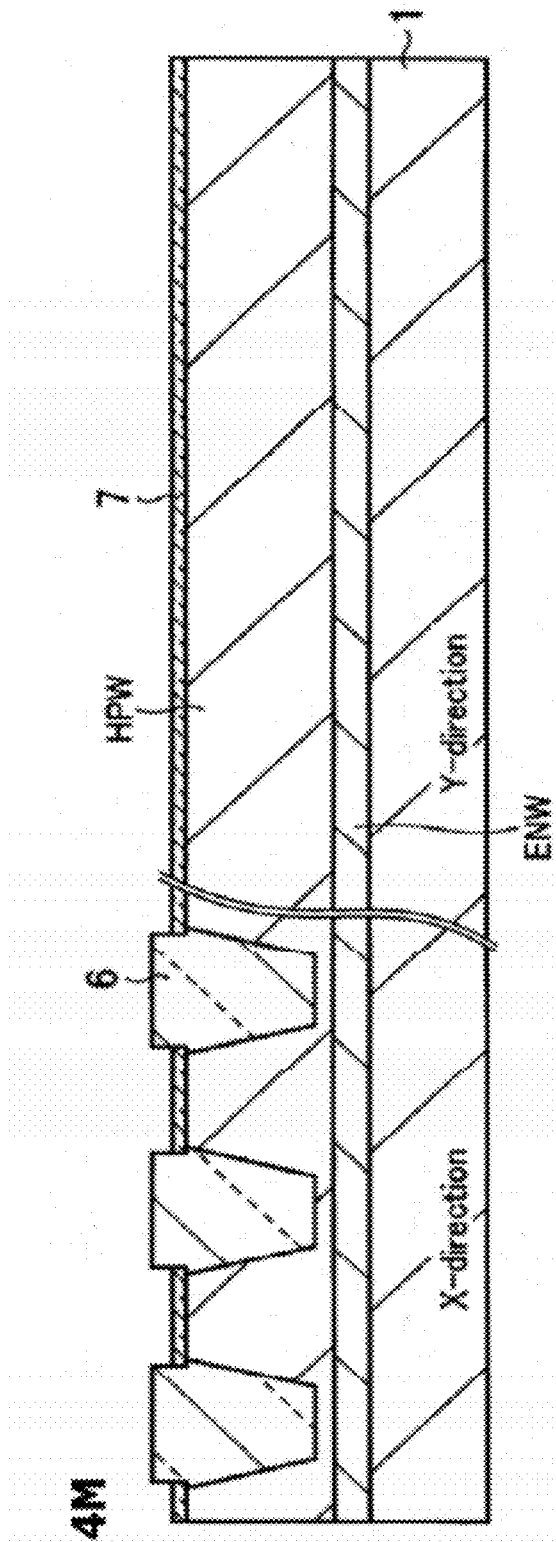
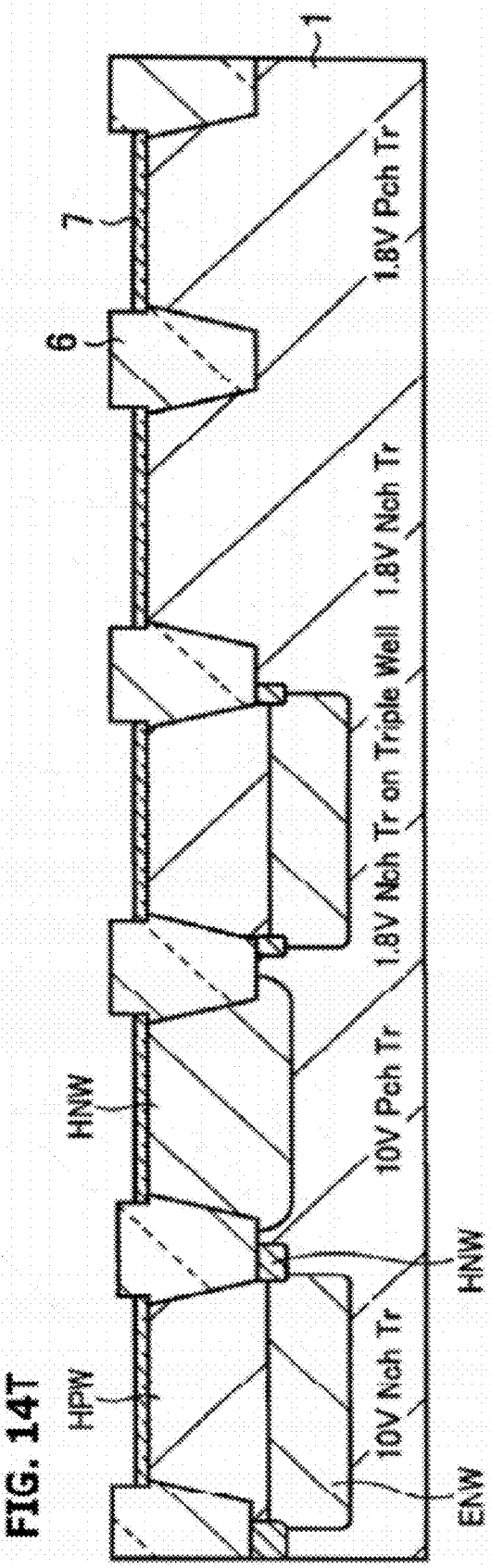
FIG. 14M
FIG. 14T

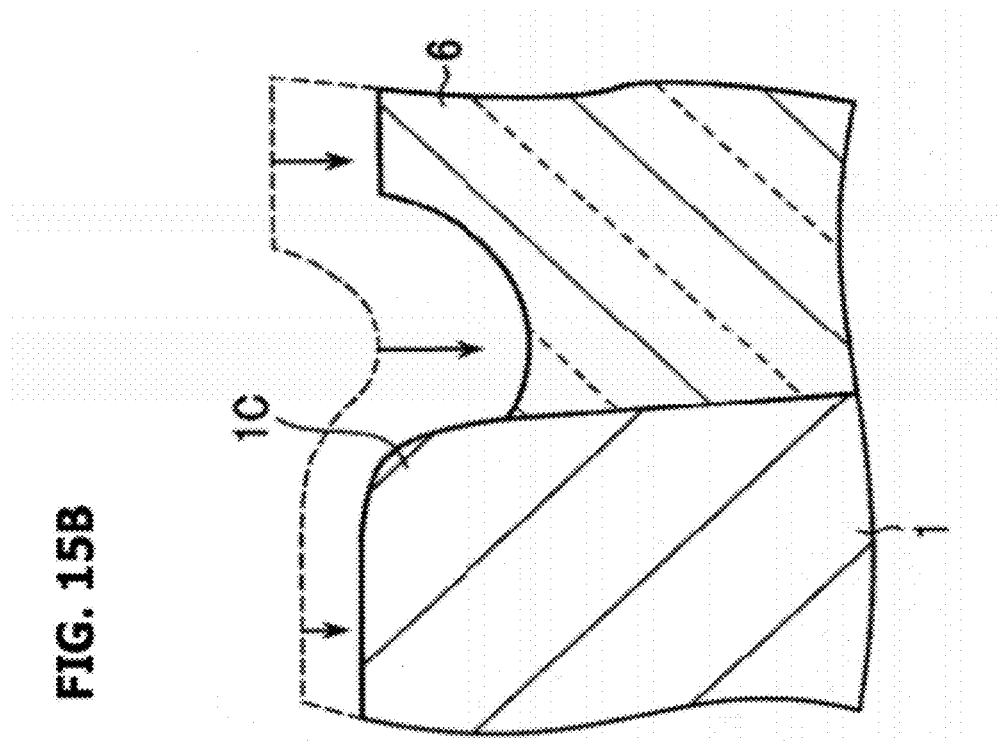
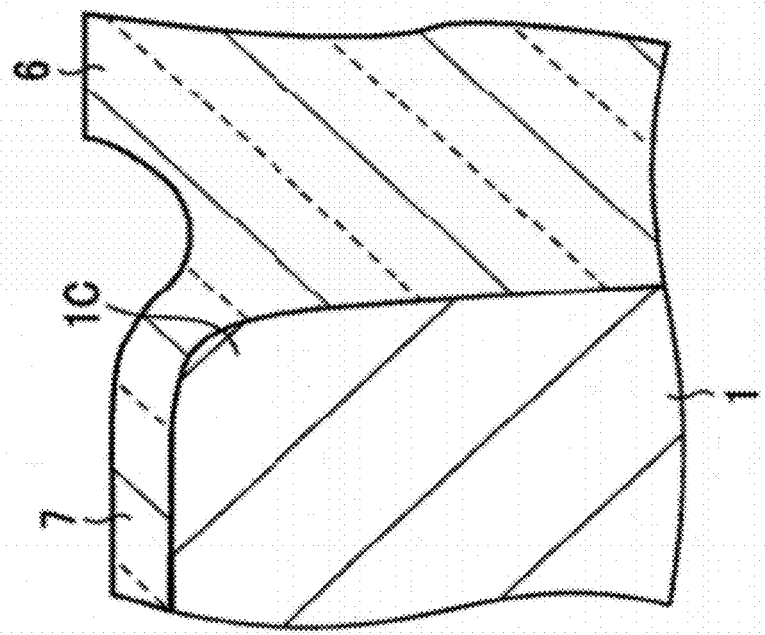
FIG. 15A
FIG. 15B

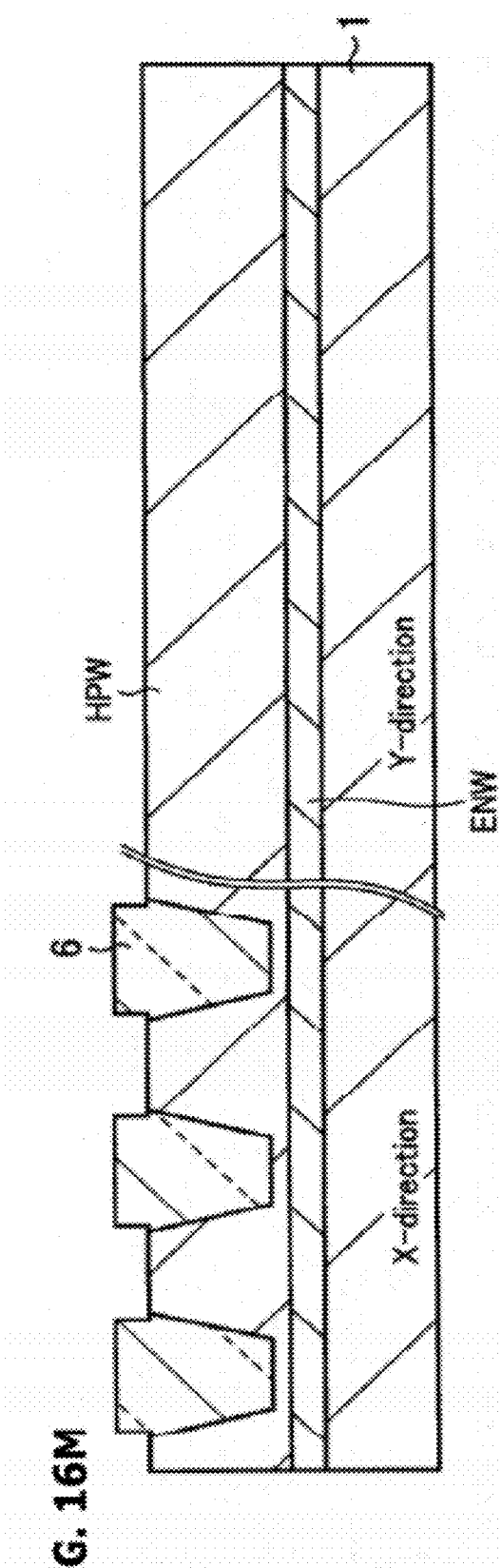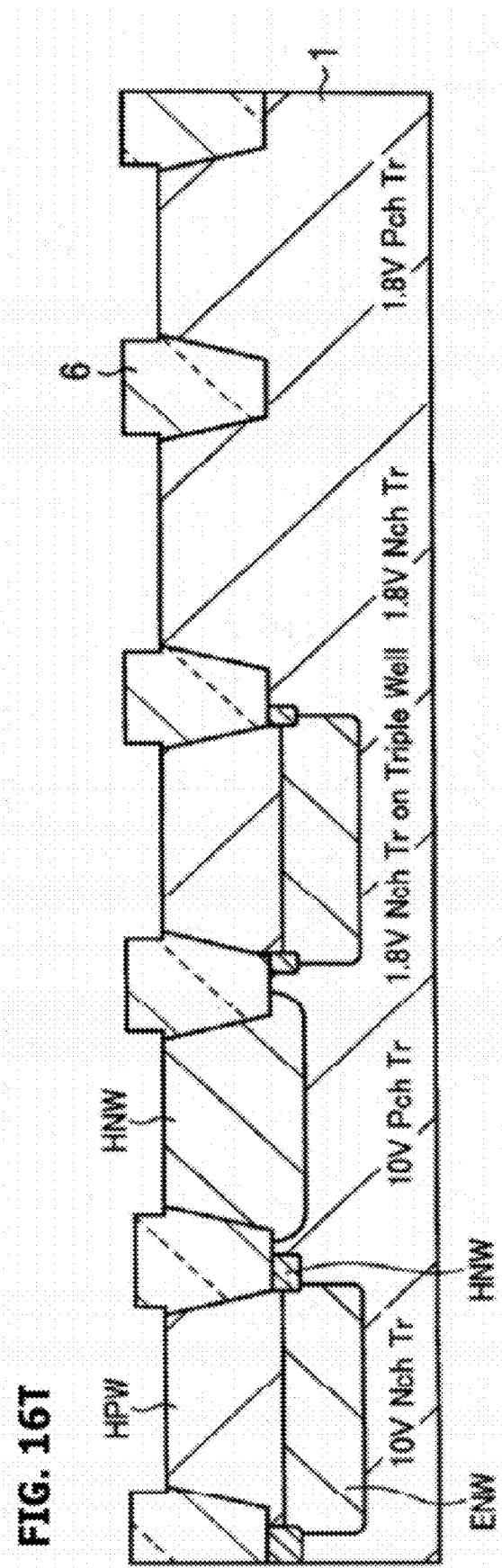

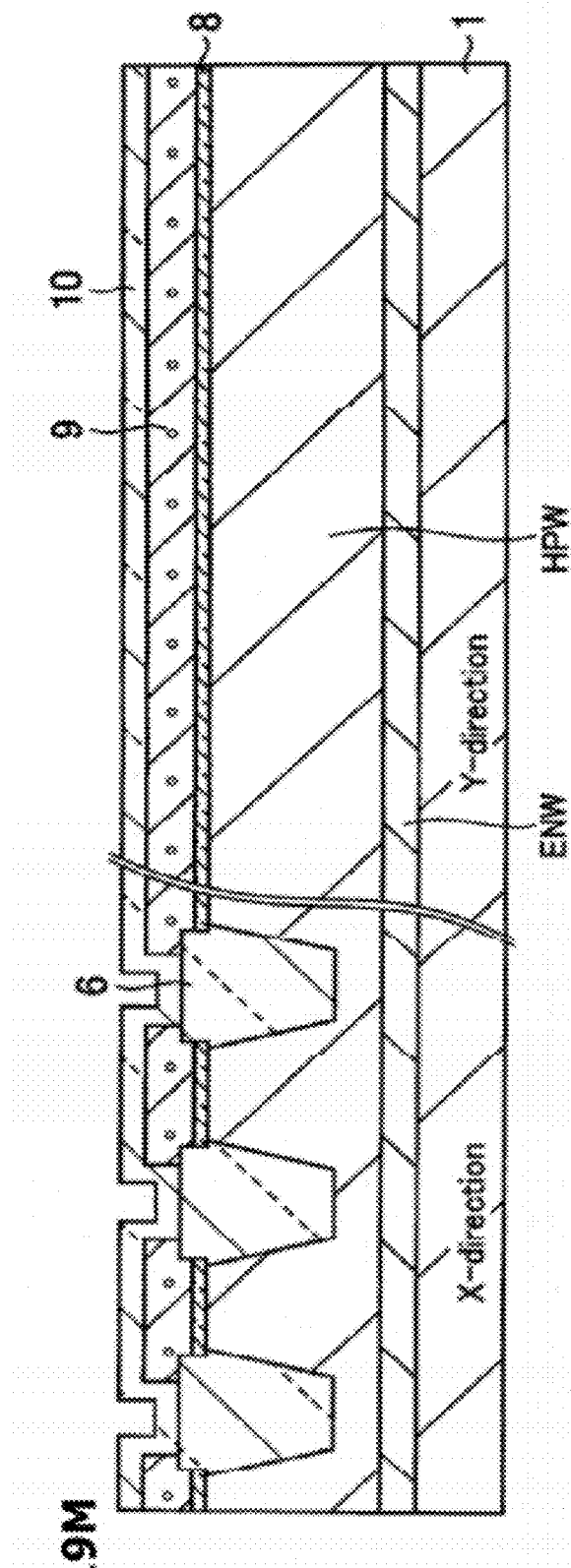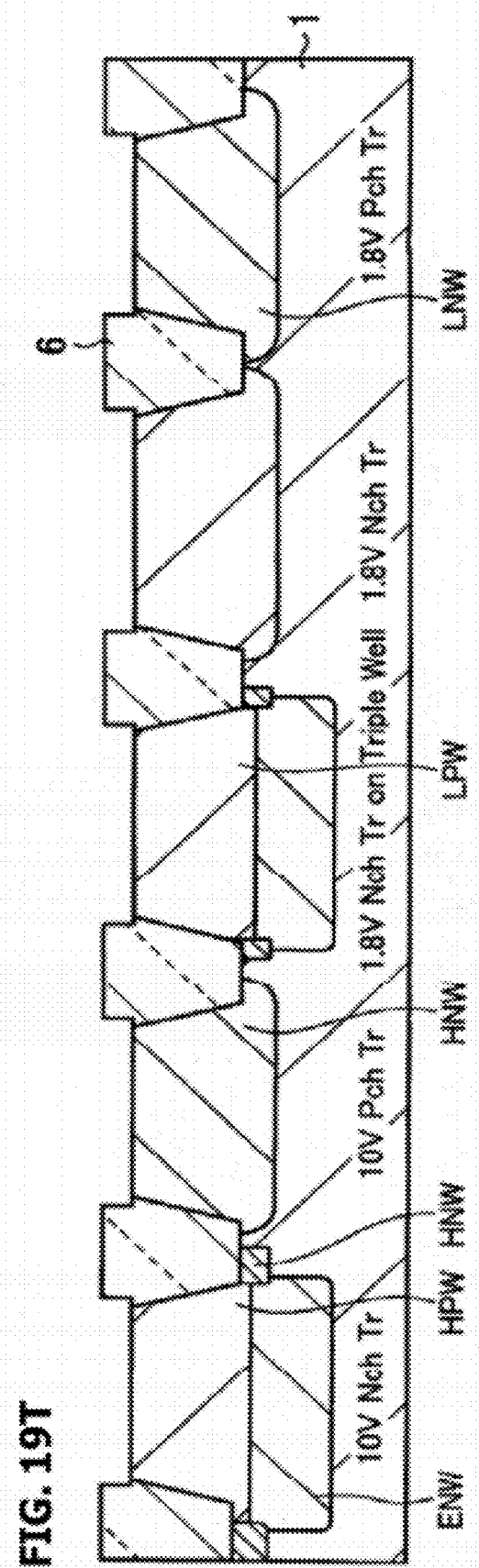

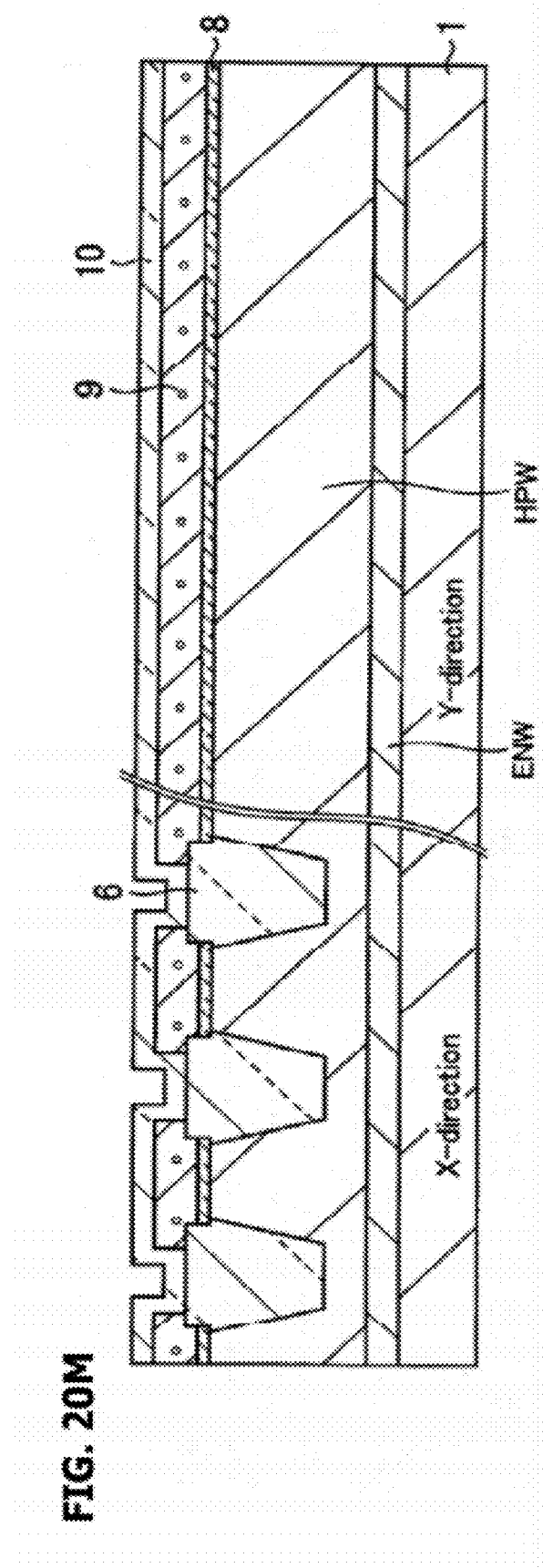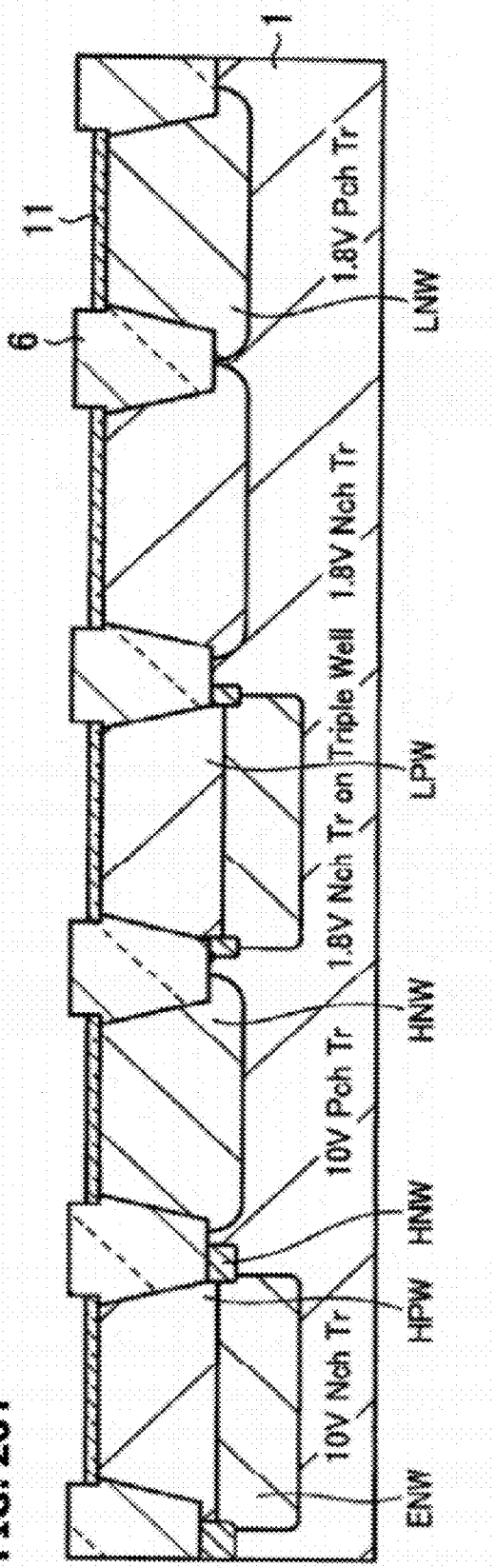
FIG. 20M
FIG. 20T

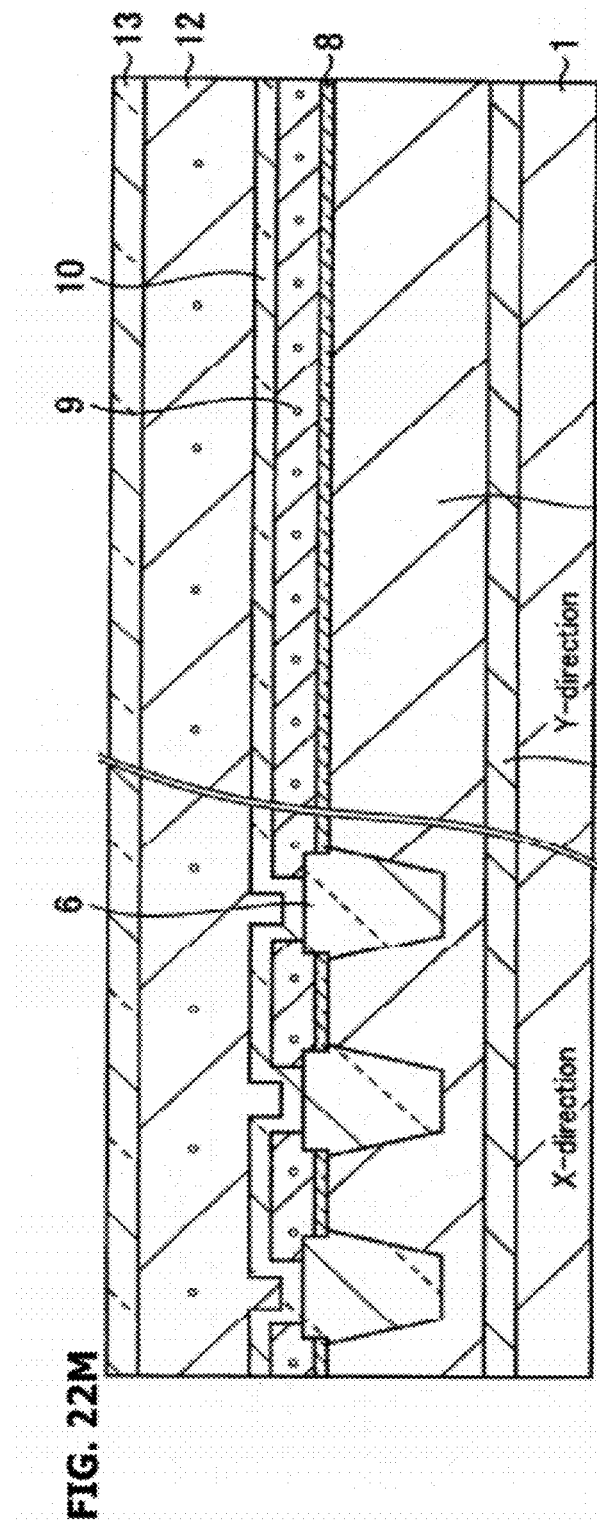
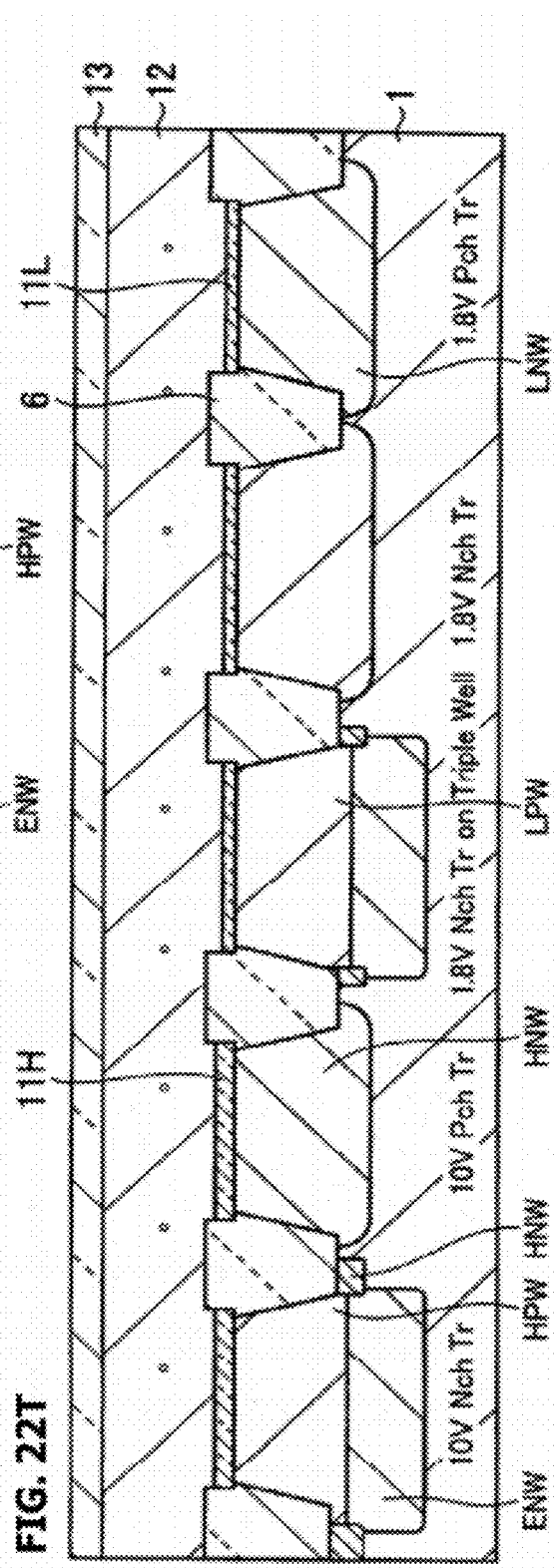
FIG. 22M
FIG. 22T

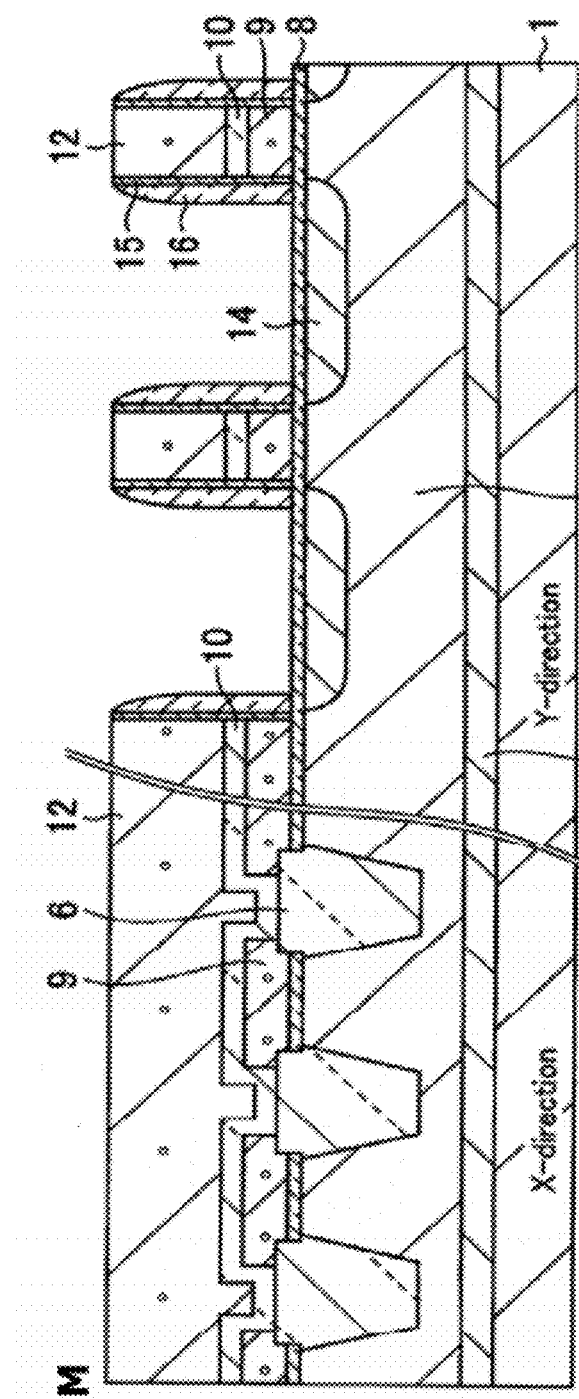
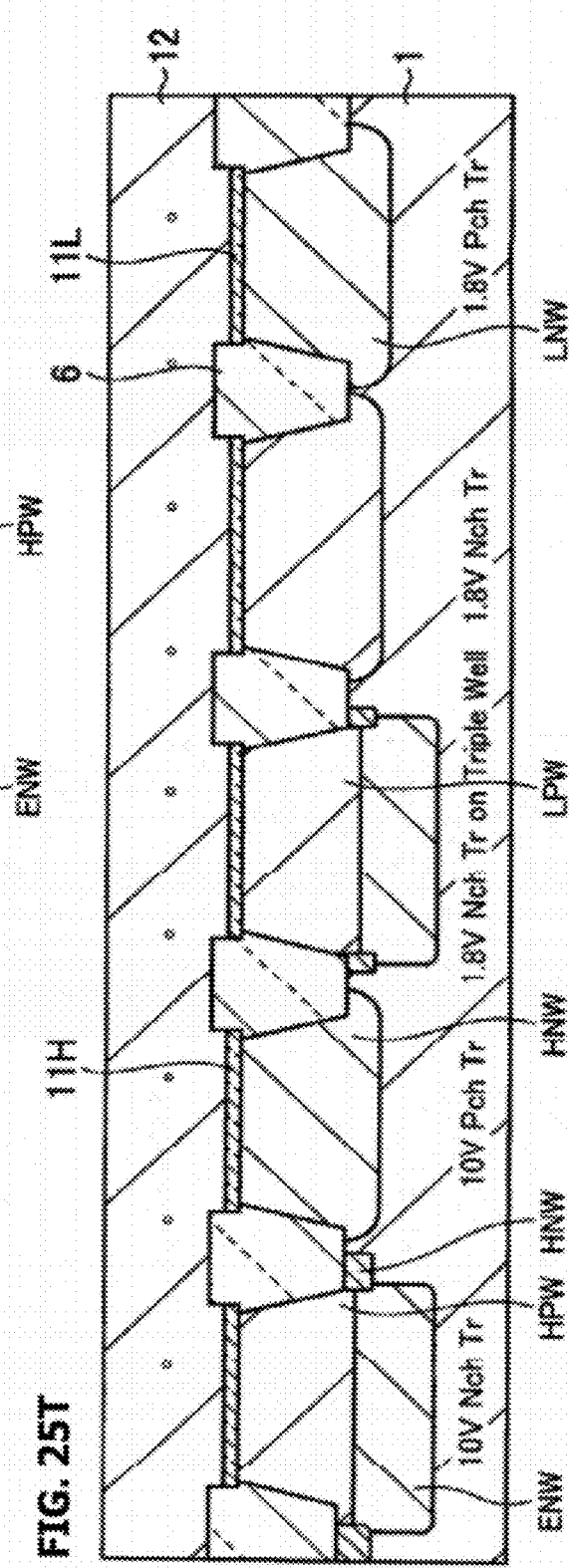
FIG. 25M
FIG. 25T

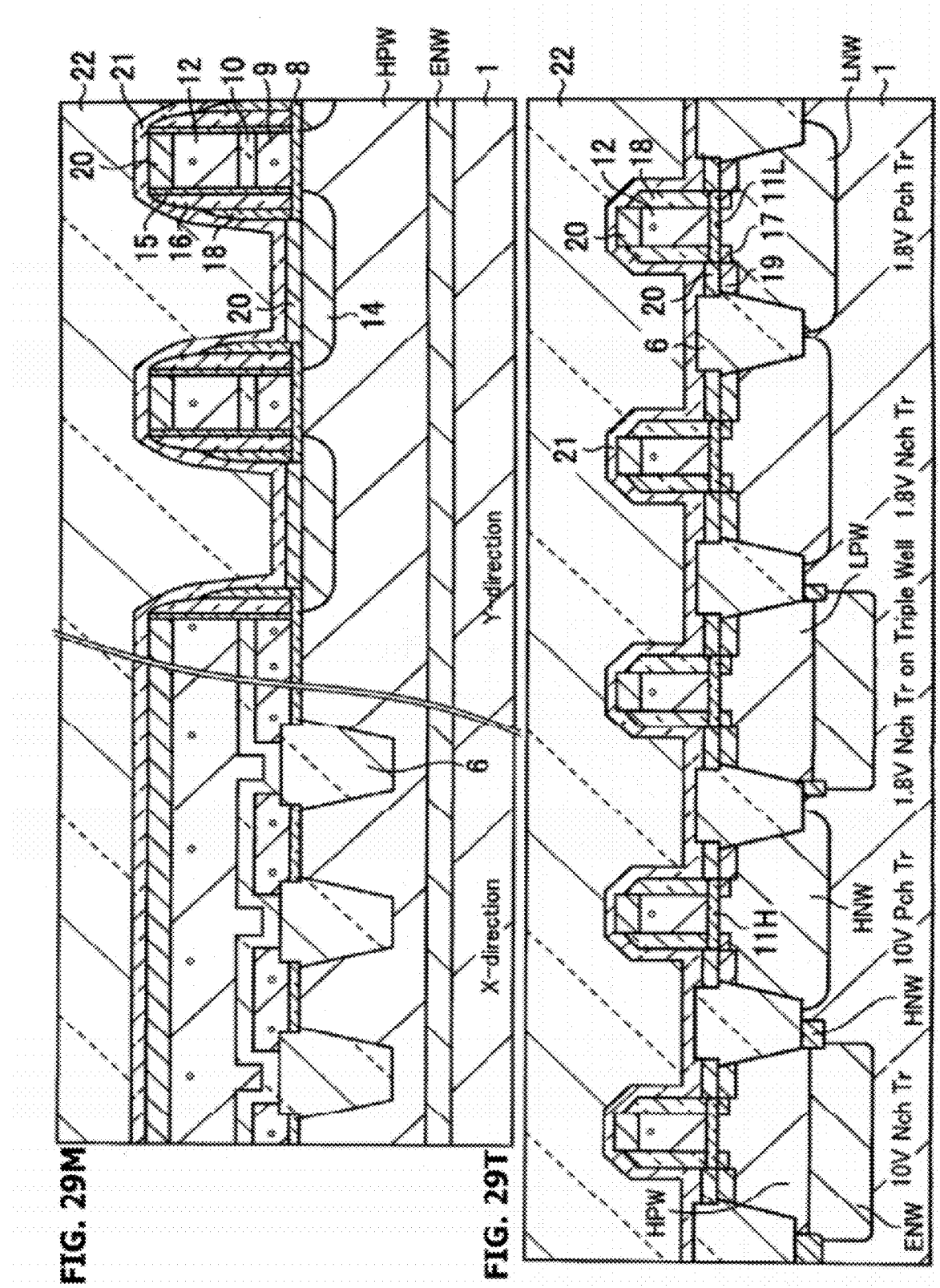

_US 8,951,844 B2_

METHOD OF PRODUCING A SEMICONDUCTOR DEVICE INCLUDING TREATMENT WITH DILUTE HYDROFLUORIC ACID

CROSS-REFERENCE TO RELATED APPLICATION

This application is based upon and claims the benefit of priority of the prior Japanese Patent Application JP2011-135617, filed on Jun. 17, 2011, the entire contents of which are incorporated herein by reference.

FIELD

The embodiments discussed herein are related to a semiconductor device production method.

BACKGROUND

Various cleaning techniques have been used in producing semiconductor devices (for instance, see Japanese Patent Laid-open Publication No. 2001-53050). The available cleaning techniques include, for instance, treatment with dilute aqueous hydrofluoric acid solution (DHF), aqueous ammonia and hydrogen peroxide mixture solution (APM), or aqueous hydrochloric acid and hydrogen peroxide mixture solution (HPM). Note that DHF treatment, for instance, is not always intended for cleaning alone, but it may also be performed, for instance, for removing a silicon oxide film from a particular region.

SUMMARY

According to one aspect of the present invention, a semiconductor device production method includes: treating a wafer which contains a silicon substrate with dilute hydrofluoric acid in a bath; introducing water into the bath while discharging the dilute hydrofluoric acid from the bath; and introducing $H_2O_2$ and warm water warmer than the above-mentioned water into the bath after the discharge of dilute hydrofluoric acid from the bath in such a manner that the introduction of warm water is started simultaneously with the start of $H_2O_2$ supply or subsequently to the start of $H_2O_2$ supply.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 1 gives a table summarizing features of treatment with DHF, APM, and HPM.

FIGS. 4A to 4C give TEM photographs of a wafer treated according to the comparative example.

FIG. 6A is a TEM photograph of a wafer treated with DHF, FIG. 6B a TEM photograph of a wafer treated according to the embodiment, and FIG. 6C a TEM photograph of a wafer treated according to the comparative example.

FIGS. 9M and 9T to 14M and 14T are schematic cross sections illustrating major steps of a semiconductor device production process according to the application example.

FIGS. 15A and 15B are schematic cross sections illustrating major steps of a semiconductor device production process according to the application example.

FIGS. 16M and 16T to 30M and 30T are schematic cross sections illustrating major steps of a semiconductor device production process according to the application example.

DESCRIPTION OF EMBODIMENTS

First, described below are the treatment with a dilute aqueous hydrofluoric acid solution (DHF), treatment with an aqueous ammonia and hydrogen peroxide mixture solution (APM), and treatment with an aqueous hydrochloric acid and hydrogen peroxide mixture solution (HPM) which are used in semiconductor device production processes.

FIG. 1 gives a table summarizing features of treatment with DHF, APM, and HPM. DHF treatment uses a dilute hydrofluoric acid aqueous solution (DHF) consisting of water ($H_2O$) mixed with hydrofluoric acid (HF) and is performed for removal of an oxide film and metal. These treatments are commonly performed at room temperature, but may be conducted at a temperature higher than room temperature as required for control of the etching rate and the like. Room temperature is, for instance, 24° C. to 26° C. (for instance, 25° C.). Note that it is difficult for DHF treatment to remove a metal with a high redox potential (for instance, Cu).

APM treatment uses an aqueous ammonia and hydrogen peroxide mixture solution (APM) consisting of water ($H_2O$) mixed with a hydrogen peroxide solution ($H_2O_2$) and aqueous ammonia ($NH_4OH$) and is performed for removal of particles and the like. It is preferable that the treatment temperature is higher than room temperature for improved removal performance and it is, for instance, 40° C. to 80° C.

HPM treatment uses an aqueous hydrochloric acid and hydrogen peroxide mixture solution (HPM) consisting of water ($H_2O$) mixed a hydrogen peroxide solution ($H_2O_2$) and hydrochloric acid (HCl) and is performed for removal of metal and the like. It is preferable that treatment temperature is higher than room temperature for improved removal performance and it is, for instance, 60° C. to 80° C.

Figure 2:
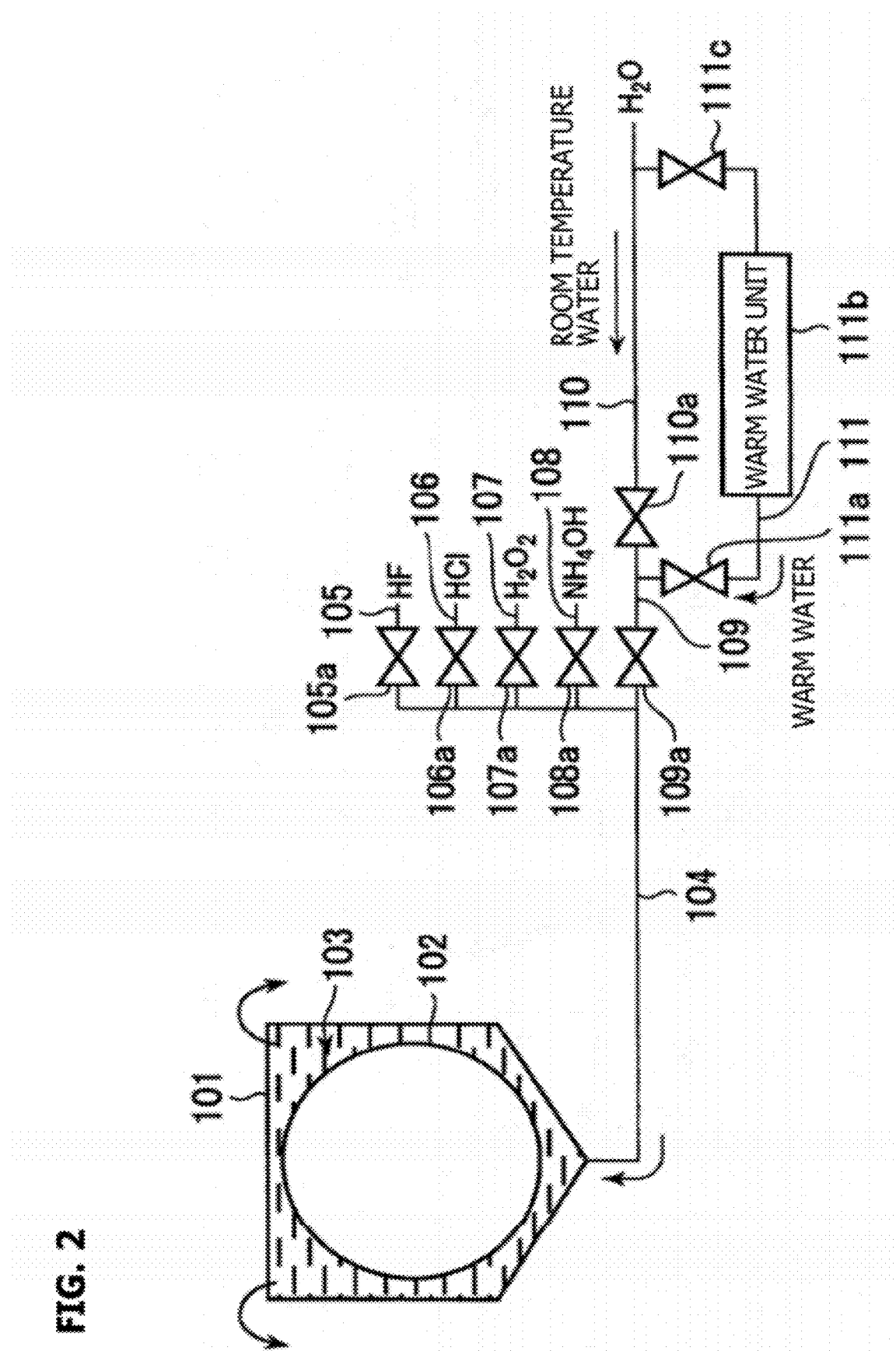
FIG. 2 schematically illustrates an apparatus for treatment with DHF, APM, and HPM.

FIG. 2 schematically illustrates an apparatus for treatment with DHF, APM, and HPM. This treatment apparatus is a one-bath treatment apparatus in which DHF treatment, APM treatment, and HPM treatment are performed in one bath.

A wafer 102 to be treated is placed in a bath 101. The water and treatment solution supplied to the bath 101 are collectively referred to as treatment solution 103. The bath 101 is structured so that treatment solution 103 is supplied to the bottom and discharged from the top. The treatment solution 103 in the bath 101 can be replaced by changing the treatment solution 103 supplied to the bath 101. This serves for a changeover among DHF treatment, APM treatment, and HPM treatment while holding the wafer 102 in the bath 101.

When two or more treatments (for instance, DHF treatment and HPM treatment) are carried out sequentially, the wafer 102 can be held in the treatment solution 103 from the start to the end of the treatments. This prevents adherence of particles and contamination from being caused from exposure to the air during treatment. In the case, for instance, of an in-between rinsing type treatment process that uses separate baths for different treatments (for instance, DHF treatment performed in a DHF treatment bath, followed by rinsing in a rinsing bath and then HPM treatment in a HPM treatment bath), adherence of particles on the wafer or other contaminations can often take place due to exposure to the air during transfer between baths.

The treatment solution 103 is introduced to the bath 101 through a main supply pipe 104. A HF supply pipe 105, HCl supply pipe 106, $H_2O_2$ supply pipe 107, $NH_4OH$ supply pipe 108, and room temperature water/warm water supply pipe 109 are connected to the main supply pipe 104 through valves 105a to 109a, respectively. The supply start/stop control for HF, HCl, $H_2O_2$ and $NH_4OH$ is achieved by opening and closing the valves 105a to 108a. The supply start/stop control for room temperature water/warm water is achieved by opening and closing the valve 109a.

The room temperature water supply pipe 110 and the warm water supply pipe 111 are connected to the room temperature water/warm water supply pipe 109 through the valves 110a and 111a, respectively. Water of room temperature is supplied from a $H_2O$ source to the room temperature water supply pipe 110 or the warm water supply pipe 111. The warm water supply pipe 111 is equipped with a warm water unit 111b to heat water to a required temperature and connected to the $H_2O$ source through the valve 111c which is provided between the warm water unit 111b and the $H_2O$ source.

To supply room temperature water to the bath 101, the valve 110a is opened and the valves 111a and 111c are closed. To supply warm water to the bath 101, the valve 110a is closed and the valves 111a and 111c are opened.

The pure water to be used for the semiconductor device production process is controlled in terms of the number of fine particles, metal concentrations, organic substance concentrations, dissolved oxygen concentration, and the like. It is preferable that the dissolved oxygen concentration is minimized in order to, for instance, prevent natural oxide from growing on silicon. The dissolved oxygen concentration in pure water is commonly in the range of, for instance, 2 ppm to 3 ppm when receiving at a semiconductor device production plant, but reduced by degassing to, for instance, below 2 ppb for use in the production process.

Describe next are the treatment steps according to a comparative example. The treatment steps according to comparative example include APM treatment, DHF treatment, and HPM treatment carried out in this order. APM treatment, DHF treatment, and HPM treatment as included in the comparative example are commonly performed to, for instance, form isolation film by shallow trench isolation (STI) in a MOS transistor production process. More detailed description is given below.

Figure 7M:
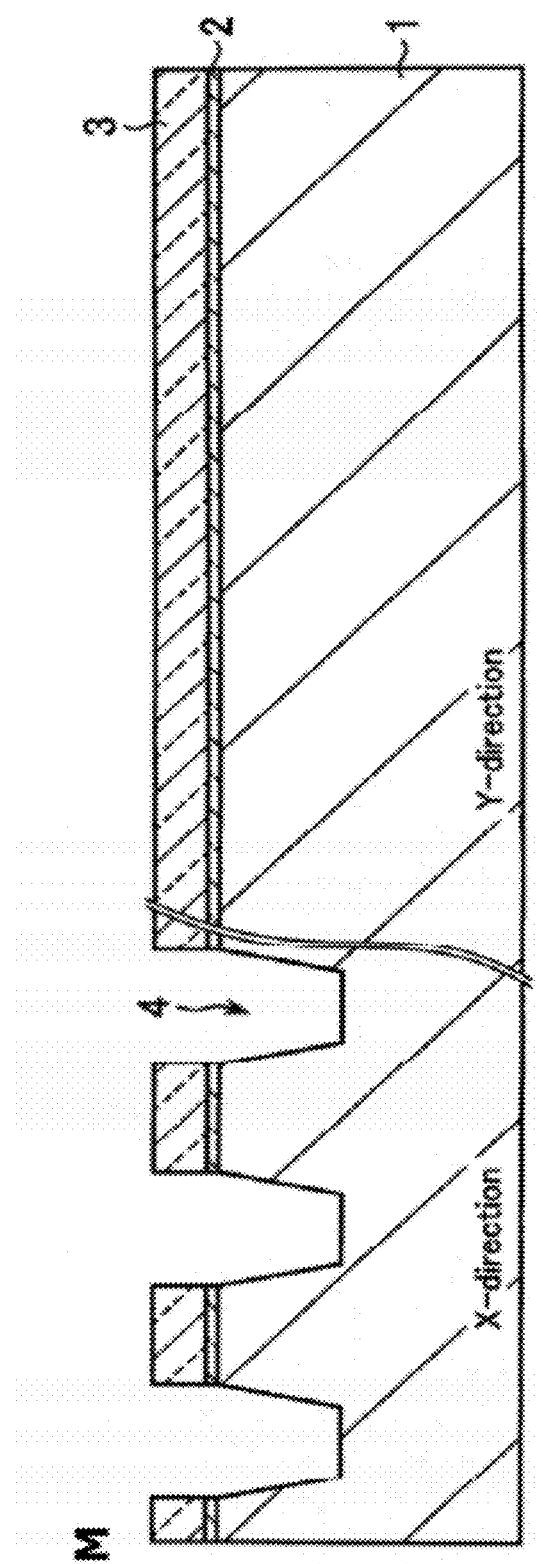
FIGS. 7M and 7T are schematic cross sections illustrating a major step of a semiconductor device production process according to an application example.
Figure 7T:
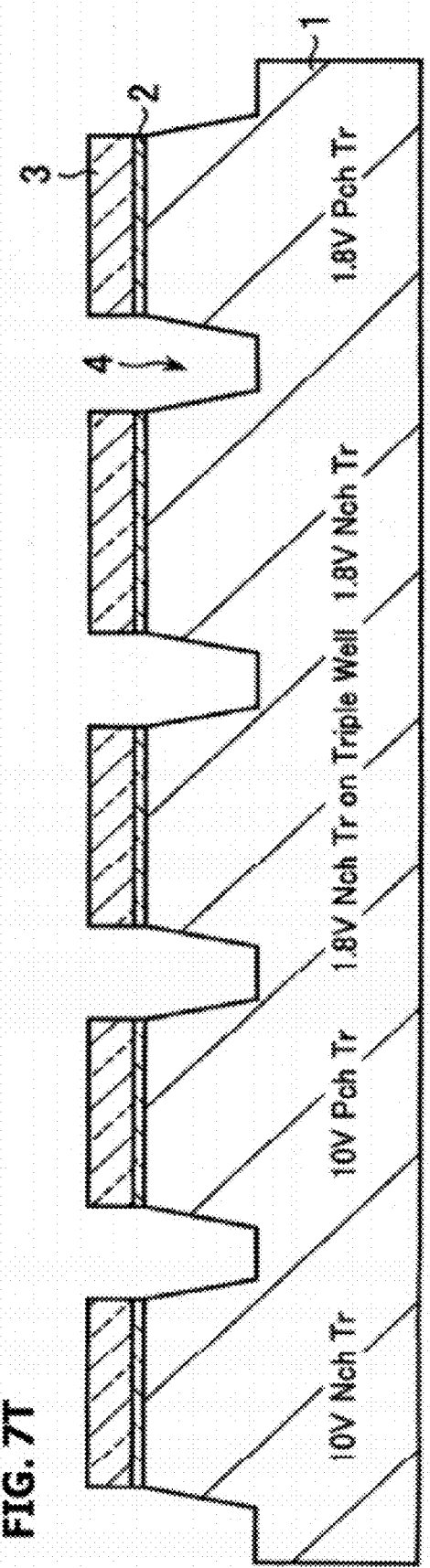

FIGS. 7M and 7T are schematic cross sections illustrating the formation of isolation trenches for buried isolation films in a silicon substrate 1. A silicon oxide film (initial oxide film) 2 is formed on the silicon substrate 1 by thermal oxidation, and a nitride film (isolation nitride film) 3 is formed on the initial oxide film 2, followed by patterning the isolation nitride film 3 into a shape having openings in the portions where isolation trenches 4 are to be formed. The initial oxide film 2 and the silicon substrate 1 are etched using the isolation nitride film 3 as mask to form isolation trenches 4.

Figure 8C:
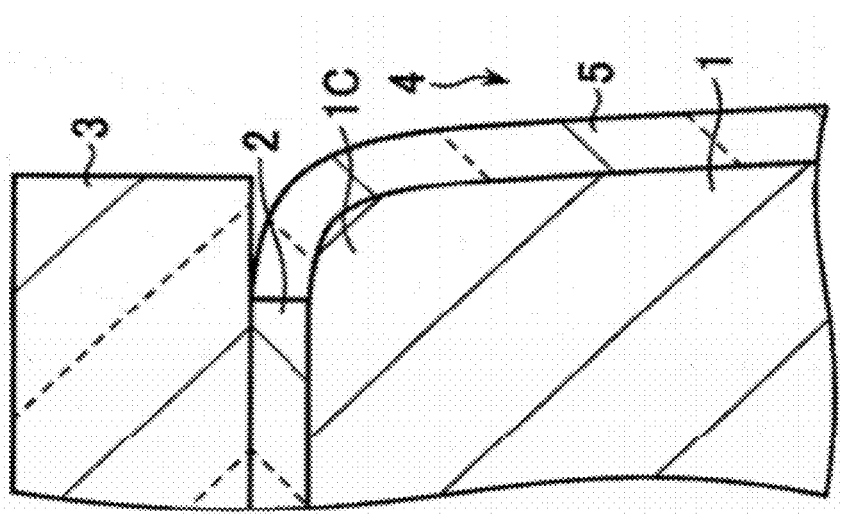
FIGS. 8A to 8C are schematic cross sections illustrating major steps of a semiconductor device production process according to the application example.
Figure 8B:
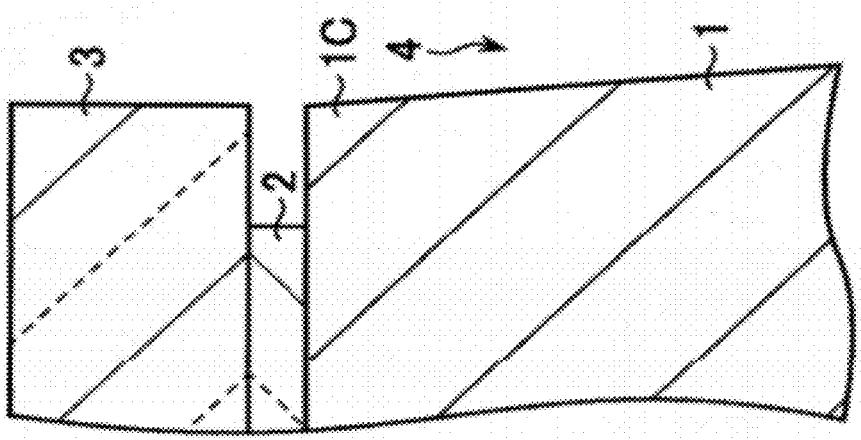
Figure 8A:
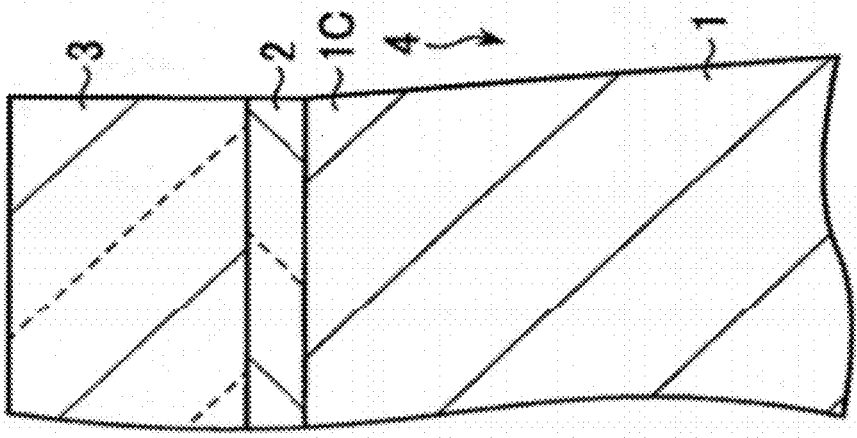

FIGS. 8A to 8C are enlarged cross sections illustrating an isolation trench 4 and its vicinity. FIG. 8A illustrates a stage immediately after the formation of an isolation trench 4. The corner 1C of the silicon substrate 1 that defines the edge of the isolation trench 4 is at the end of the active region. If the corner 1C at the end of the active region has a sharp edge, high electric field can be caused at the corner 1C as the MOS transistor is driven. Hereinafter, the corner 1C is also referred to as the corner of an isolation trench.

Subsequently, DHF treatment is carried out as illustrated in FIG. 8B. During the DHF treatment, the end of the initial oxide film 2 shifts back inward and the top face of the corner 1C is exposed.

Then, the corner 1C is subjected to thermal oxidation to form a silicon oxide film 5 as illustrated in FIG. 8C. This thermal oxidation rounds the corner 1C. The rounding of the corner 1C depresses the high electric field described above. Subsequently, an isolation film is embedded in the isolation trench 4.

DHF treatment also removes other materials such as native oxide film to partially expose the silicon surface of the substrate 1. The exposed silicon surface is hydrophobic and prone to attract particles. In addition, some metals cannot be removed by DHF treatment alone. Here, HPM treatment is performed for cleaning after the DHF treatment in FIG. 8B and before the thermal oxidation in FIG. 8C. Note that APM treatment is performed for cleaning after the formation of the isolation trench 4 in FIG. 8A and before the DHF treatment in FIG. 8B.

Figure 3:
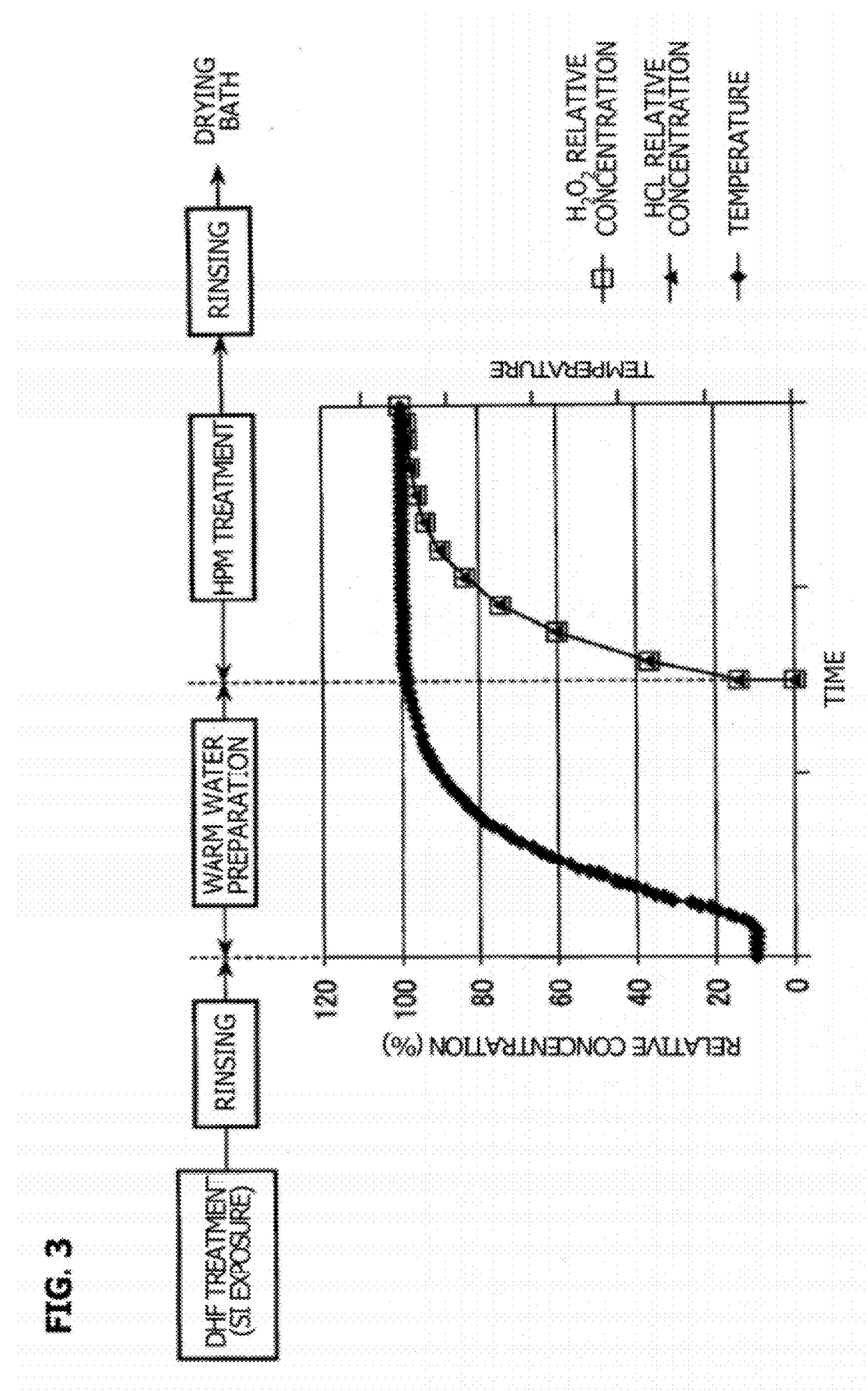
FIG. 3 gives a flow chart for treatment according to a comparative example and curves illustrating changes in the treatment solution temperature and $H_2O_2$ and HCl concentrations.

A flow chart for treatment according to the comparative example is given at the top of FIG. 3. DHF treatment is performed (after APM treatment). The DHF treatment exposes the silicon surface of the substrate. After the DHF treatment, to perform rinsing, room temperature water is introduced to the bath so that the treatment solution is replaced with room temperature water. After the rinsing with room temperature water, warm water is introduced to the bath as a preliminary step for HPM treatment which uses warm water (warm water preparation). After getting warm water ready, a hydrogen peroxide solution and hydrochloric acid are introduced to the bath, and HPM treatment is carried out. After the HPM treatment, to perform rinsing, room temperature water is introduced to the bath so that the treatment solution is replaced with room temperature water. Then, the wafer is transferred to a drying bath where it is dried.

Changes in the treatment solution temperature in the bath and the $H_2O_2$ and HCl concentrations in the treatment solution during warm water preparation and HPM treatment are illustrated in the lower part of FIG. 3. The $H_2O_2$ and the HCl concentration are presented in terms of relative concentration to the target concentration for the HPM treatment step, the target concentration being assumed to be 100%.

In the warm water preparation step, the introduction of warm water to the bath raises the water temperature. After the water temperature in the bath has reached the target temperature for HPM treatment, $H_2O_2$ and HCl are introduced to the bath to start HPM treatment.

Problems arising from the treatment steps according to the comparative example are described below. FIGS. 4A to 4C give transmission electron microscope (TEM) photographs of a wafer that is treated according to the comparative example.

FIG. 4A, which corresponds to FIG. 8A, gives a photograph taken after isolation trenches are formed in the silicon substrate. The trapezoid at the bottom center is the silicon substrate, and the region next to it is the isolation trench. An isolation nitride film is located on the silicon substrate with an initial oxide film sandwiched in between.

FIG. 4B, which corresponds to FIG. 8B, gives a photograph taken after the end of the initial oxide film has shifted back as a result of the DHF treatment following the APM treatment.

FIG. 4C gives a photograph taken after the HPM treatment following the DHF treatment. The corners of the isolation trenches are circled by a broken line in FIG. 4C. As described above, the corners are rounded by the thermal oxidation following the HPM treatment. It is desirable that the rounding of the corners is controlled in this thermal oxidation step. For this, it is preferred that the shape of the corners keeping after the formation of the isolation trenches is maintained until the start of this thermal oxidation.

As seen from FIG. 4B, the shape of the corners keeping after the formation of the isolation trenches is maintained nearly unchanged until the end of the DHF treatment. After the HPM treatment, however, the corners have been rounded by etching as illustrated in FIG. 4C. Such etching is not desirable from the viewpoint of maintaining the shape of the corners until the start of thermal oxidation.

Thus, the present inventors conducted studies on the factors in the etching of the corners of the isolation trenches. As presented in FIG. 3, DHF treatment is followed by rinsing, warm water preparation, and HPM treatment in the process of the comparative example. The solution used for HPM treatment, which contains $H_2O_2$ and HCl, is acidic. In an acidic treatment solution, silicon is more stable in a solid state than in an ionic state, suggesting that silicon will not be etched significantly. It is strongly expected, accordingly, that silicon is etched by water during the rinsing step and warm water preparation step. In particular, stronger etching may be taking place in warm water, which is higher in temperature (for instance, 30° C. or more) than room temperature water.

Describe next are the treatment steps according to an embodiment of the invention. As in the case of the comparative example, APM treatment, DHF treatment, and HPM treatment are performed in, for instance, isolation film formation step of a MOS transistor production process.

Figure 5:
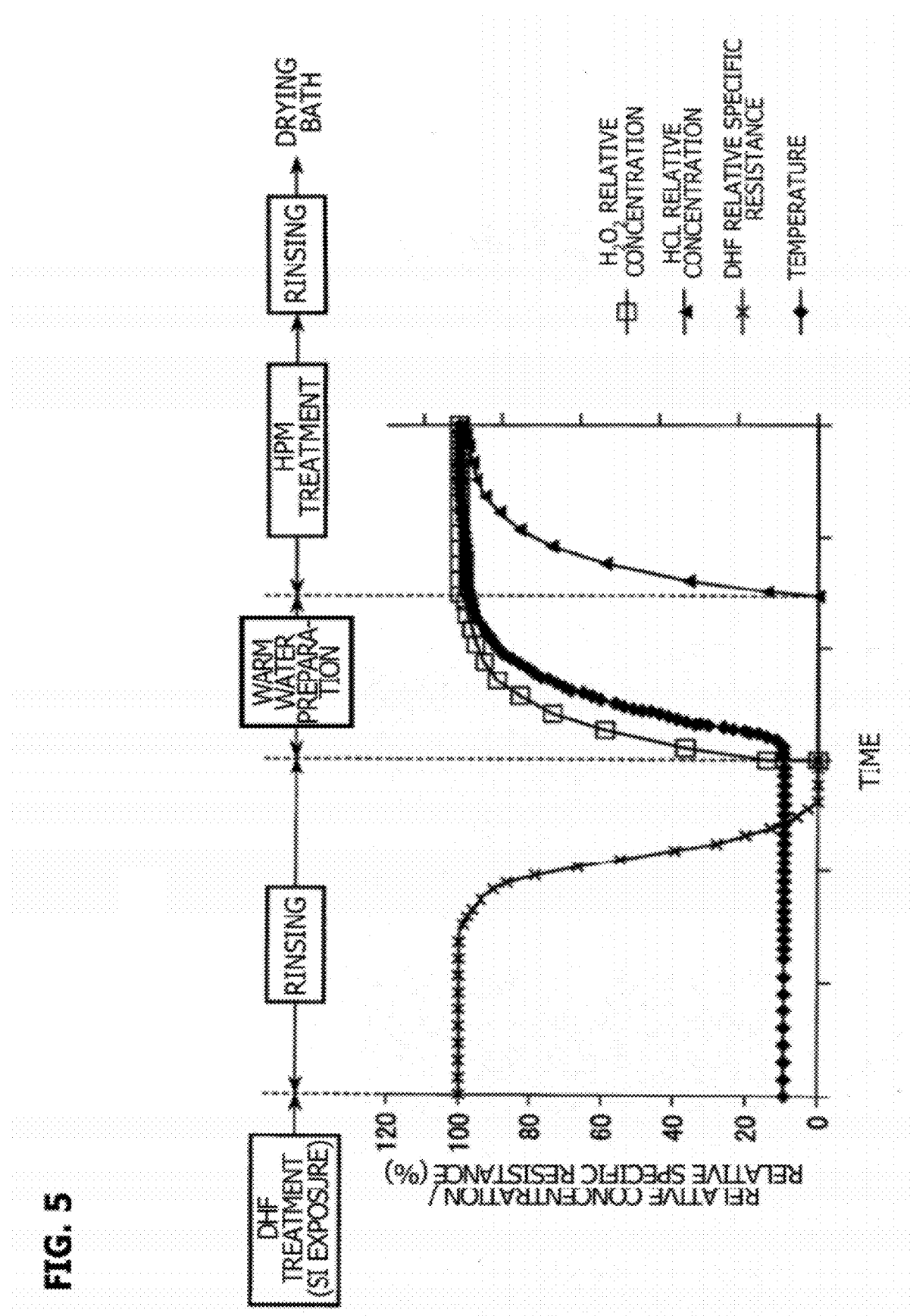
FIG. 5 gives a flow chart for treatment according to an embodiment of the invention and curves illustrating changes in the treatment solution temperature, $H_2O_2$ and HCl concentrations, and specific resistance.

A flow chart for treatment according to the embodiment is given at the top of FIG. 5. Changes in the treatment solution temperature in the bath and the $H_2O_2$ and HCl concentrations in the treatment solution during rinsing, warm water preparation and HPM treatment are illustrated in the lower part of FIG. 5. Changes in the specific resistance of the treatment solution during rinsing are also given. The $H_2O_2$ and HCl concentrations are presented in terms of relative concentration as in the case of the description for the comparative example. The specific resistance of the treatment solution is presented as relative values assuming that it is 100% at the time of the completion of DHF treatment and 0% at the time of the completion of rinsing.

The flow chart for treatment according to the embodiment is described below. DHF treatment is performed (after APM treatment). The DHF treatment exposes the silicon surface of the substrate. The DHF treatment is followed by rinsing. In the rinsing step, room temperature water is introduced to the bath while the DHF solution (dilute hydrofluoric acid) is discharged from the bath, thus replacing the treatment solution with room temperature water. Whether the treatment solution has been replaced with water in the rinsing step is determined by, for instance, analyzing the specific resistance. It is assumed that the replacement of the treatment solution with water has completed when the specific resistance of the treatment solution has reached that of pure water (about 18.3 MΩ·cm).

The rinsing is followed by warm water preparation. In addition to warm water, $H_2O_2$ to be used for HPM treatment is also supplied in advance to the bath in the warm water preparation step according to the embodiment. The supply of $H_2O_2$ to the bath is started after the treatment solution has been replaced with room temperature water in the rinsing step. The supply of warm water is scheduled to start simultaneously with or subsequently to the start of $H_2O_2$ supply.

After the treatment solution temperature has reached the target temperature for HPM treatment, the supply of HCl to the bath is started to initiate HPM treatment. Rinsing after the HPM treatment, and subsequent drying is carried out as in the case of the comparative example.

In the case of the embodiment, $H_2O_2$ is introduced to the treatment solution during the warm water preparation step. This is expected to work for forming a thin oxide film on the silicon surface that has been exposed by DHF treatment, thereby depressing the etching of silicon by warm water.

Etching of silicon by water may take place regardless of the presence of dissolved oxygen, but it appears that etching proceeds more rapidly when the dissolved oxygen concentration in water is low. Significant etching can occur at dissolved oxygen concentrations of, for instance, 80 ppb or less. It appears that etching in pure water of a low dissolved oxygen concentration proceeds so as to expose a structurally stable plane (for instance, (111) plane) of silicon and accordingly, it can be understood that this tendency toward exposure of a stable plane in pure water of a low dissolved oxygen concentration explains the fact that the corners are damaged obliquely with the width of the isolation trenches maintained unchanged in the TEM photographs for the comparative example.

From the viewpoint of depressing the etching of silicon, it is desirable that the treatment solution contains $H_2O_2$ when the temperature of the treatment solution has risen. Starting the supply of warm water simultaneously with or subsequently to the start of $H_2O_2$ supply ensures that the treatment solution contains $H_2O_2$ at the time of temperature elevation.

Note that etching of silicon is expected to occur to some extent in room temperature water though at a lower etching rate than in warm water. This seems to suggest that it may be effective to introduce $H_2O_2$ in the middle of the rinsing step following the DHF treatment step. However, if $H_2O_2$ is introduced in the middle of the rinsing step when some dilute hydrofluoric acid still remains in the treatment solution, oxidation of silicon by $H_2O_2$ and etching of silicon oxide by dilute hydrofluoric acid take place repeatedly, resulting in excessive etching of silicon. Thus, it is desirable for the introduction of $H_2O_2$ to be started after dilute hydrofluoric acid has been discharged.

FIGS. 6A to 6C are TEM photographs of a wafer. FIG. 6A is a photograph taken after the DHF treatment. FIG. 6B is a photograph taken after the HPM treatment according to the embodiment. For comparison, FIG. 6C gives a photograph after the HPM treatment according to the comparative example (the same photograph as in FIG. 4C). It can be seen that according to the embodiment, the corners of the isolation trenches are less etched after the HPM treatment.

Described below is a semiconductor device production process including treatment steps according to the embodiment. FIGS. 7M and 7T, FIGS. 8A to 8C, FIGS. 9M and 9T to 14M and 14T, FIGS. 15A and 15B, FIGS. 16M and 16T to 30M and 30T, and FIG. 31M are schematic cross sections illustrating major steps of a semiconductor device production process according to the application example. In this application example, flash memory cell transistors and peripheral transistors are formed simultaneously. The schematic cross sections of a flash memory cell transistor region are indicated by "M" while the schematic cross sections of a peripheral transistor region are indicated by "T".

Each figure of a flash memory cell transistor region combines schematic cross sections in the gate width direction (x direction) and in the gate length direction (y direction). The flash memory according to the application example includes n-type MOS transistors.

The peripheral transistors to be formed include high voltage MOS transistors designed for a word-line control circuit or the like and driven at a relatively high voltage (for instance, 10V) and low voltage MOS transistors designed for a bit-line decoder or the like and driven at a relatively low voltage (for instance 1.8V). In the application example, an n-type 10 V transistor, p-type 10 V transistor, triple-well n-type 1.8 V transistor, n-type 1.8 V transistor, and p-type 1.8 V transistor are formed in the peripheral transistor region.

Refer to FIGS. 7M and 7T. For instance, a p-type silicon substrate is prepared as silicon substrate 1. For instance, a silicon oxide film (initial oxide film) 2 with a thickness of about 10 nm is formed on the silicon substrate 1 by thermal oxidation. For instance, a silicon nitride film (isolation nitride film) 3 with a thickness of about 110 nm is deposited on the initial oxide film 2 by chemical vapor deposition (CVD).

The isolation nitride film 3 is patterned by etching through resist pattern, and the initial oxide film 2 and the silicon substrate 1 are etched using the isolation nitride film 3 as mask. Isolation trenches 4 are formed by etching the silicon substrate 1. The isolation trenches 4 have a depth of, for instance, about 300 nm.

Refer to FIGS. 8A to 8C. FIGS. 8A to 8C are enlarged cross sections illustrating a portion around an isolation trench 4. FIG. 8A illustrates a stage immediately after the formation of the isolation trench 4. The formation of the isolation trench 4 is followed by APM treatment for cleaning.

As illustrated in FIG. 8B, APM treatment is followed by DHF treatment to cut the end of the initial oxide film 2 and expose the top face of the corner 1C of the isolation trench 4. The DHF treatment is followed by HPM treatment for cleaning by the above-mentioned procedure according to the embodiment. The HPM treatment step according to the embodiment performs HPM treatment while preventing the corner 1C from excessive etching, that is, preventing the corner 1C from being rounded unnecessarily.

As illustrated in FIG. 8C, the HPM treatment is followed by thermal oxidation of the surface of the silicon substrate 1 to form a silicon oxide film 5 with a thickness of, for instance, 5 nm. A silicon oxide film 5 is formed on the inner wall of the isolation trench 4 and on the top face of the substrate 1 exposed by DHF treatment. This thermal oxidation rounds the corner 1C. The rounding of the corner 1C works to depress the high electric field while the MOS transistor is driven, as described above.

Figure 9M:
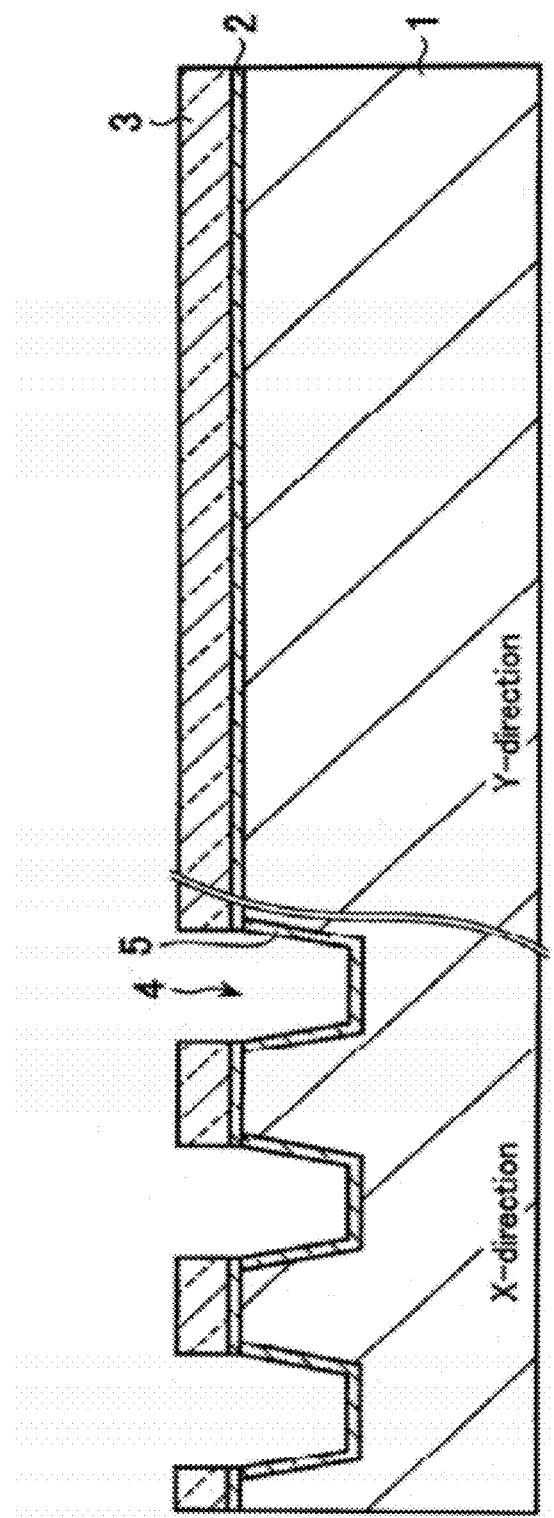
Figure 9T:
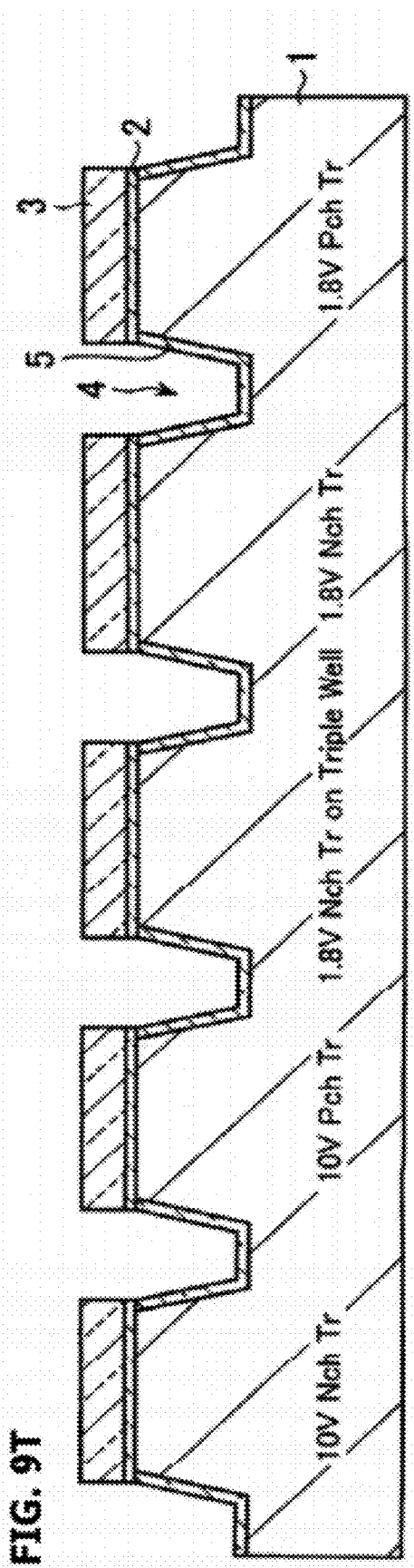

Refer to FIGS. 9M and 9T. FIGS. 9M and 9T illustrate the entire wafer after the formation of the silicon oxide film 5.

Figures 10M, 10T:
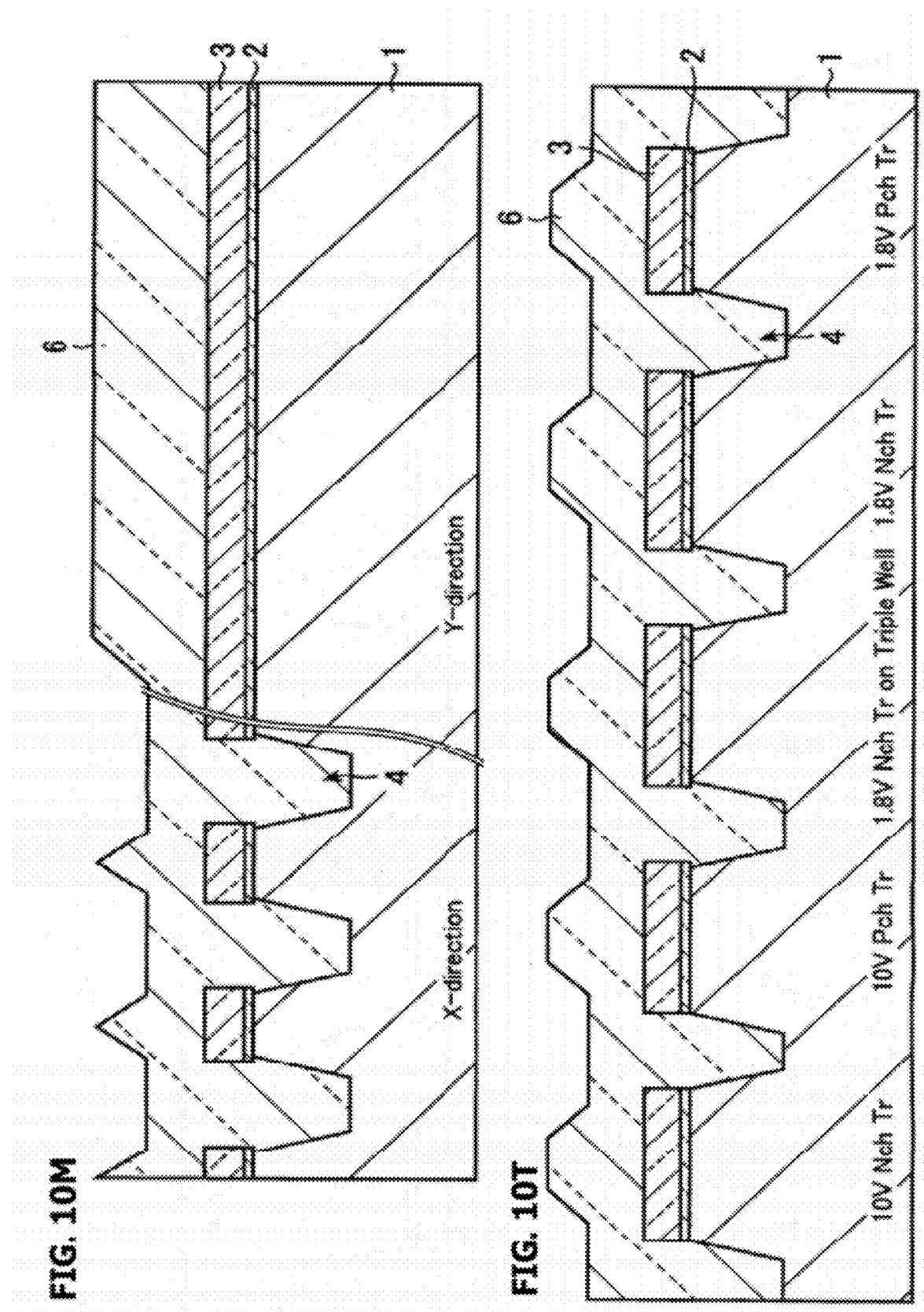

Refer to FIGS. 10M and 10T. A silicon oxide film 6 is deposited by, for instance, high density plasma (HDP) CVD to fill the isolation trenches 4 and to cover the isolation nitride film 3.

Refer to FIGS. 11M and 11T. The top part of the silicon oxide film 6 is removed by chemical mechanical polishing (CMP) to expose the isolation nitride film 3. This completes the isolation film 6 that fills each isolation trench 4.

Figure 12M:
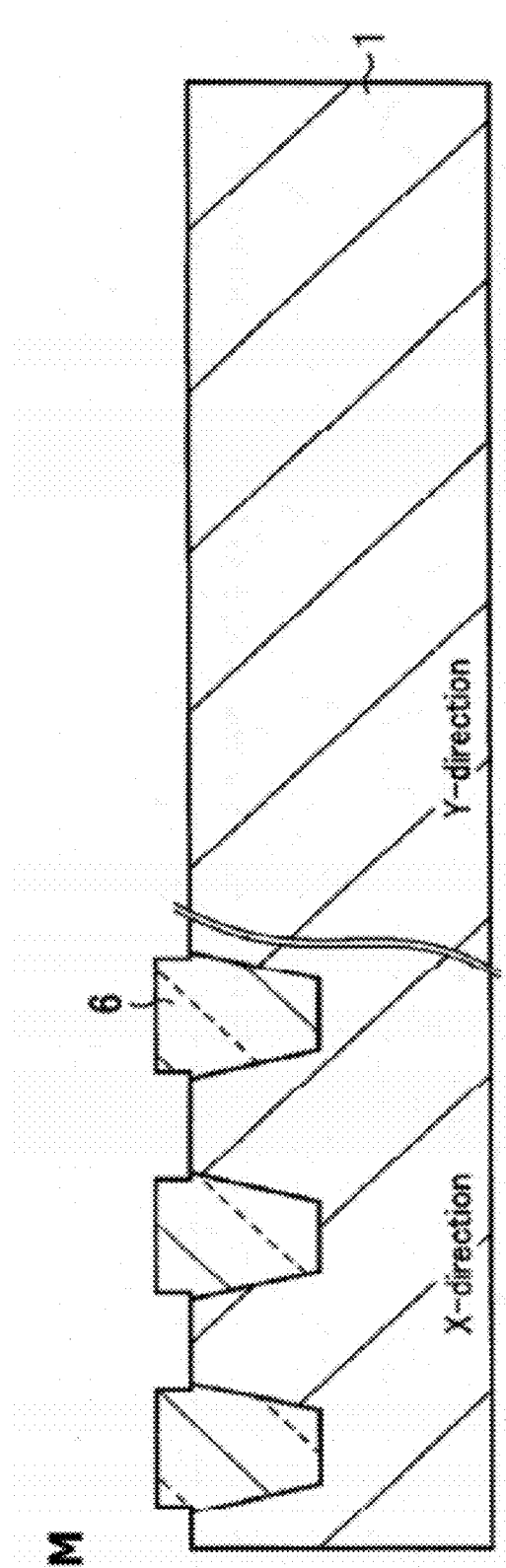
Figure 12T:
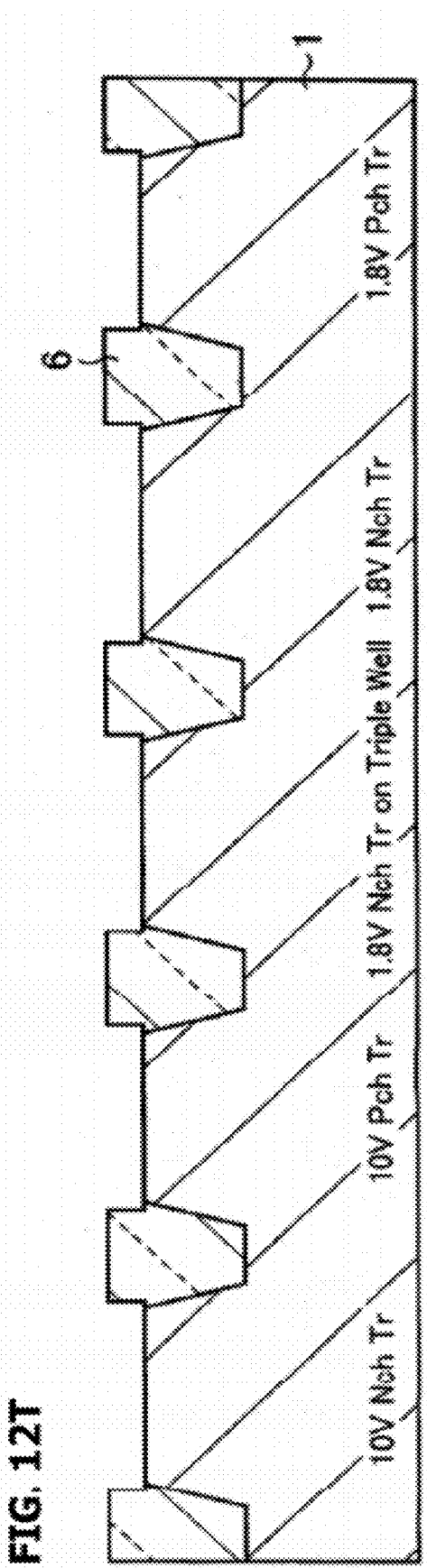

Refer to FIGS. 12M and 12T. The isolation nitride film 3 is removed by wet etching in boiling phosphoric acid. The initial oxide film 2 is removed by DHF treatment.

Figure 13M:
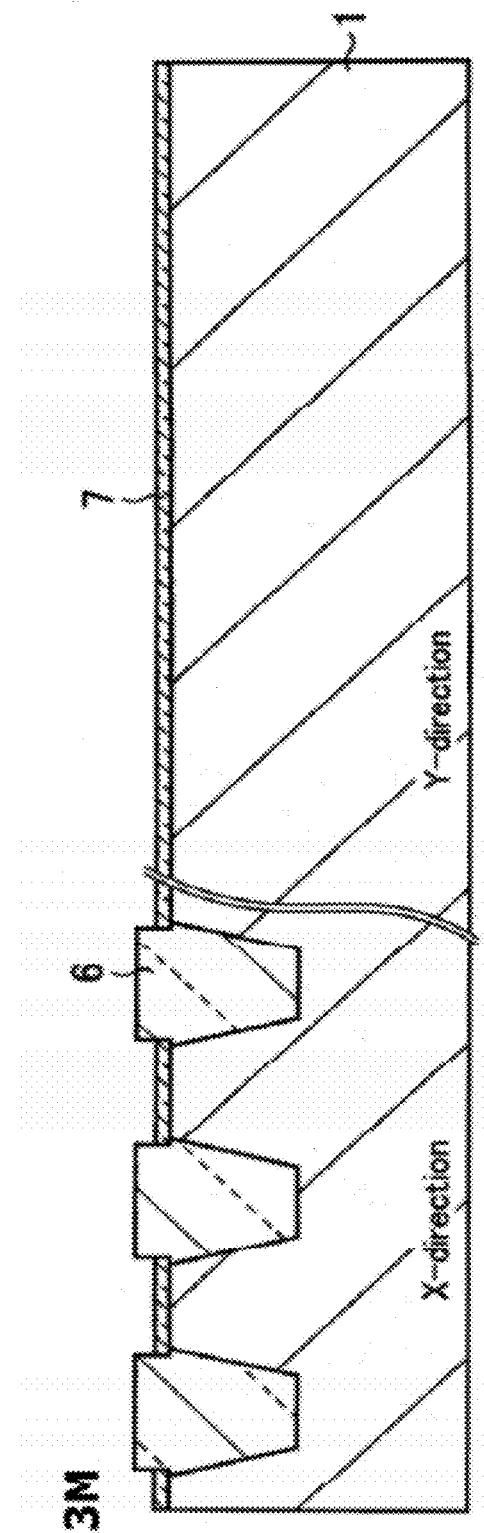
Figure 13T:
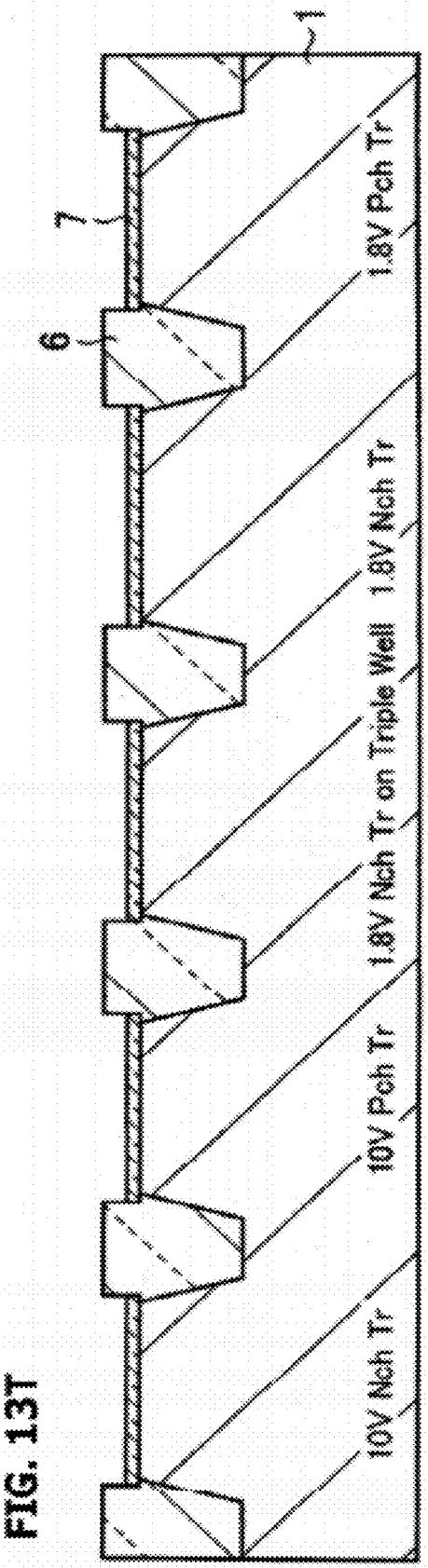

Refer to FIGS. 13M and 13T. For instance, a silicon oxide film (sacrifice oxide film) 7 with a thickness of about 10 nm is formed on the silicon substrate 1 by thermal oxidation.

Refer to FIGS. 14M and 14T. Using appropriate resist patterns, impurities required to form wells and channels are implanted in the flash memory cell region and the peripheral transistor region. High concentration p-type well HPW is formed in the entire flash memory cell region and the n-type 10 V transistor region. Note that flash memory can be constructed of p-type MOS transistor, and in that case, high concentration n-type well is formed in the flash memory cell region.

Embedded n-type well ENW is formed in the entire flash memory cell region, n-type 10 V transistor region and n-type 1.8 V triple-well transistor region.

High concentration n-type well HNW is formed in the p-type 10V transistor region, the edge portion of the n-type 10 V transistor region, and the edge portion of the n-type 1.8 V triple-well transistor region.

Refer to FIGS. 15A and 15B. FIGS. 15A and 15B are enlarged cross sections illustrating the isolation film 6 and its vicinity. FIG. 15A presents a state at the end of the impurity implantation step illustrated above with reference to FIGS. 14M and 14T. APM treatment is performed for cleaning.

As illustrated in FIG. 15B, the APM treatment is followed by DHF treatment to remove the sacrifice oxide film 7. Here, the silicon oxide in the isolation film 6 is etched at the same time. To remove the sacrifice oxide film 7 completely, the film is slightly etched over to a depth larger than the thickness of the sacrifice oxide film 7. This etching results in exposure of the corner 1C of the isolation trench.

The DHF treatment is followed by HPM treatment for cleaning by the procedure according to the embodiment. Similarly to the HPM treatment described with reference to FIG. 8B, the corner 1C is maintained exposed during this HPM treatment. It is feared that this can lead to excessive etching of the corner 1C. Such excessive etching of the corner 1C can be prevented by carrying out the HPM treatment step according to the embodiment.

Refer to FIGS. 16M and 16T. FIGS. 16M and 16T illustrate the entire wafer after the removal of the sacrifice oxide film 7. The sacrifice oxide film 7 damaged during impurity implantation is removed, and a tunnel oxide film is newly formed in the subsequent step.

Figure 17M:
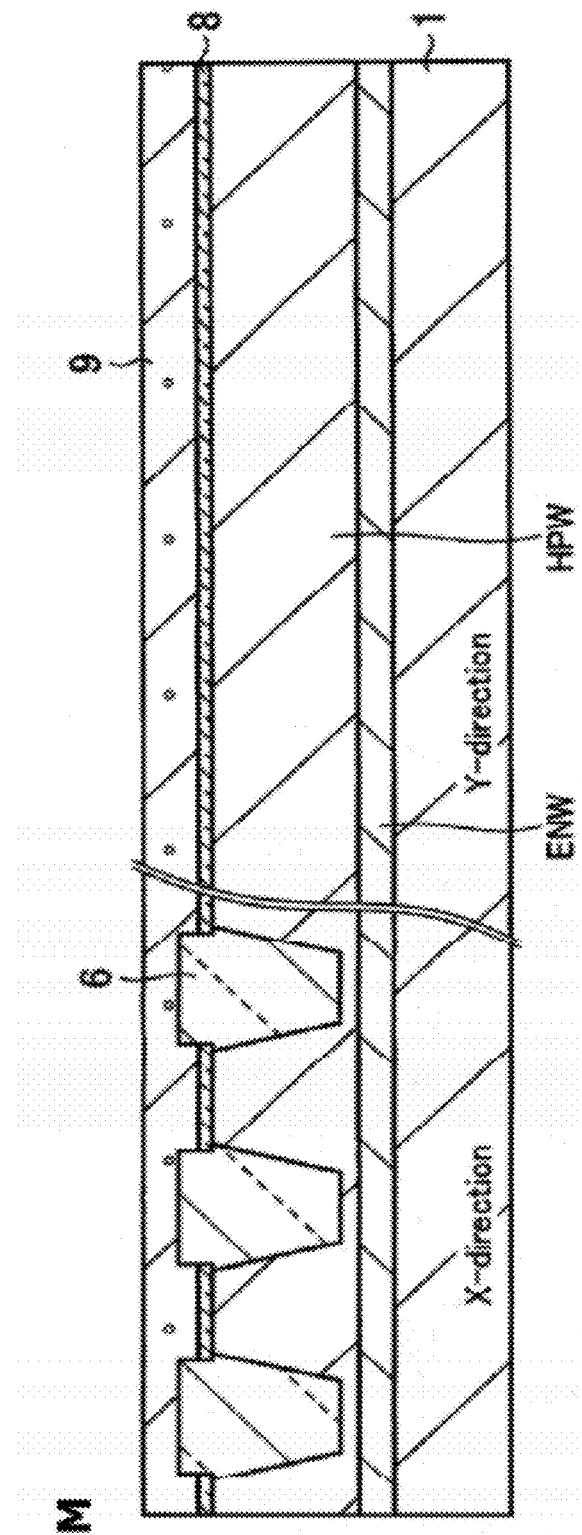
Figure 17T:
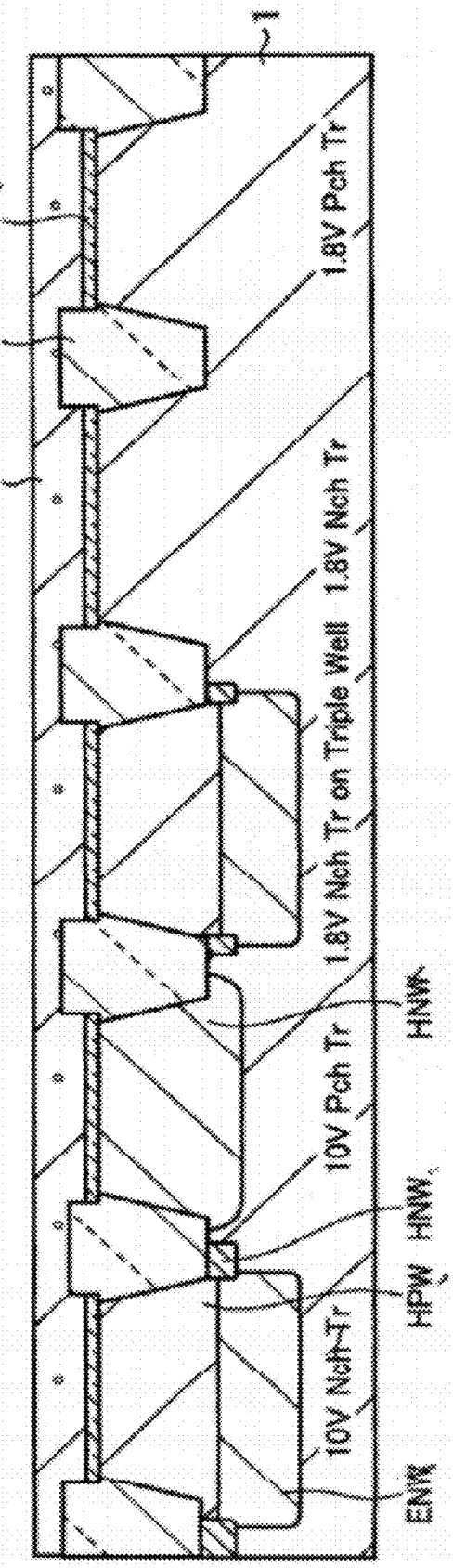

Refer to FIGS. 17M and 17T. For instance, a silicon oxide film (tunnel oxide film) 8 with a thickness of about 10 nm is formed on the silicon substrate 1 by thermal oxidation. For instance, a polysilicon film with a thickness of 90 nm is formed on the tunnel oxide film 8 by CVD to form an electrically conductive film 9 to serve as floating gate of the resulting flash memory cell transistor.

Figure 18M:
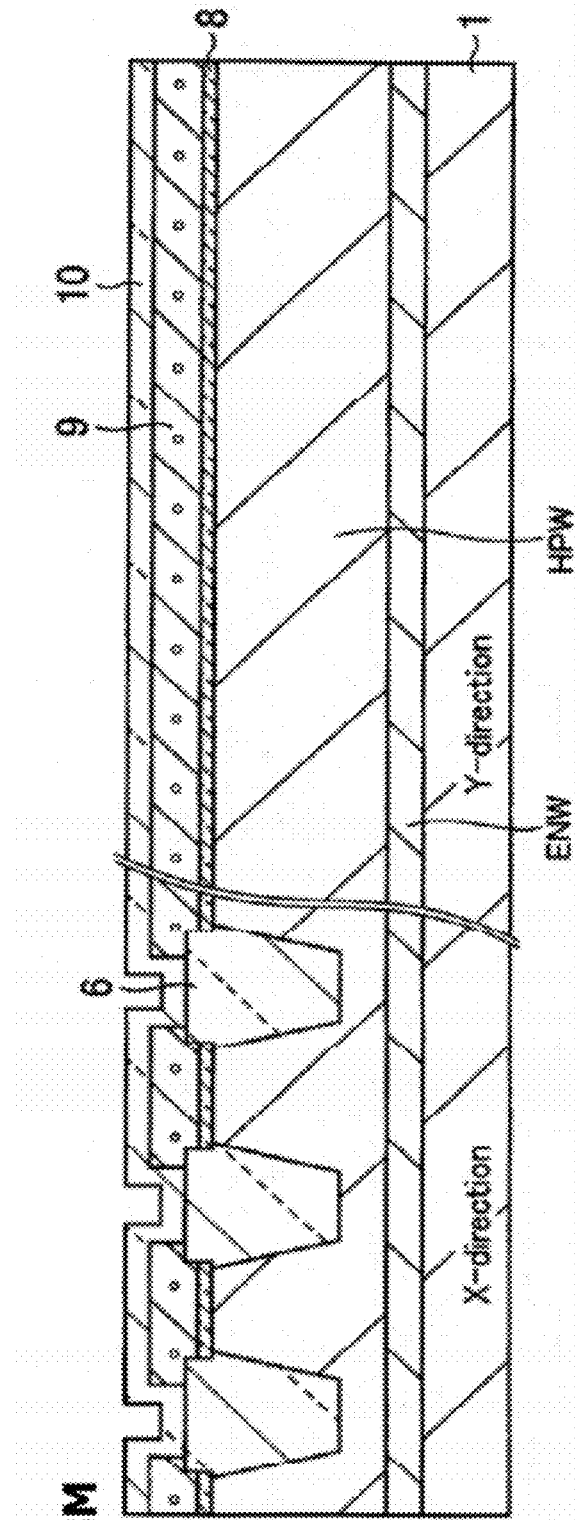
Figure 18T:
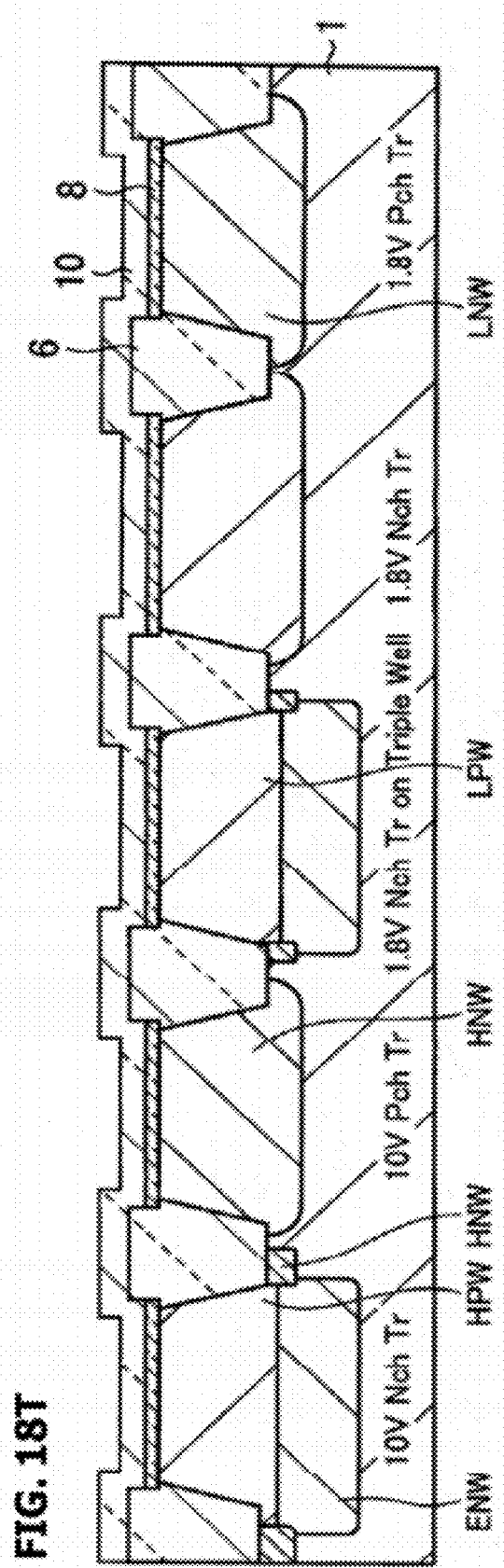

Refer to FIGS. 18M and 18T. The electrically conductive film 9 is patterned by anisotropic etching (dry etching) using resist pattern. In the flash memory cell region, the electrically conductive film 9 is divided in the gate width direction (x direction). In the peripheral transistor region, the electrically conductive film 9 is removed from the entire face.

Then, for instance, a silicon oxide film with a thickness of 5 nm is deposited on the entire face of the wafer by CVD, and for instance, a silicon nitride film with a thickness of 8 nm is deposited on this silicon oxide film by CVD, followed by thermal oxidation of this silicon nitride film to form a silicon oxynitride film with a thickness of, for instance, about 5 nm to produce an ONO film 10.

Furthermore, using appropriate resist patterns, impurities required to form wells and channels are implanted in the peripheral transistor region. Low concentration p-type well LPW is in the n-type 1.8 V triple-well transistor region and in the n-type 1.8 V transistor region. In the n-type 1.8 V triple-well transistor region, the triple well formed consists of low concentration p-type well LPW surrounded by embedded n-type well ENW and high concentration n-type well HNW. Low concentration n-type well LNW is formed in the p-type 1.8 V transistor region.

Refer to FIGS. 19M and 19T. Using resist pattern that covers the flash memory cell region, etching is carried out to remove the ONO film 10 and the tunnel oxide film 8 in the peripheral transistor region. The silicon oxynitride film and the silicon nitride film in the ONO film 10 are removed by anisotropic dry etching. While the resist still remains, the silicon oxide film and the tunnel oxide film 8 in the ONO film 10 are further removed by isotropic wet etching. Finally, the resist is removed by wet etching.

Refer to FIGS. 20M and 20T. For instance, a silicon oxide film 11 with a thickness of about 9 nm is formed on the silicon substrate 1 in the peripheral transistor region by thermal oxidation.

Figure 21M:
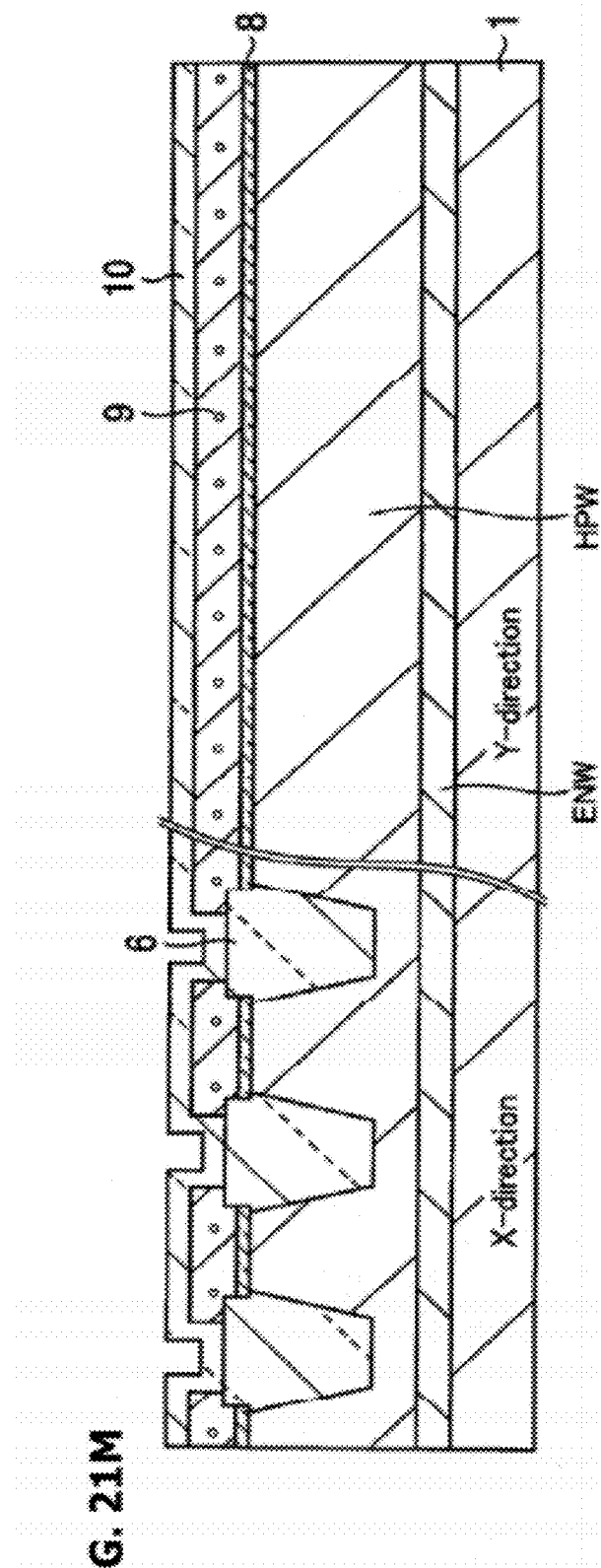
Figure 21T:
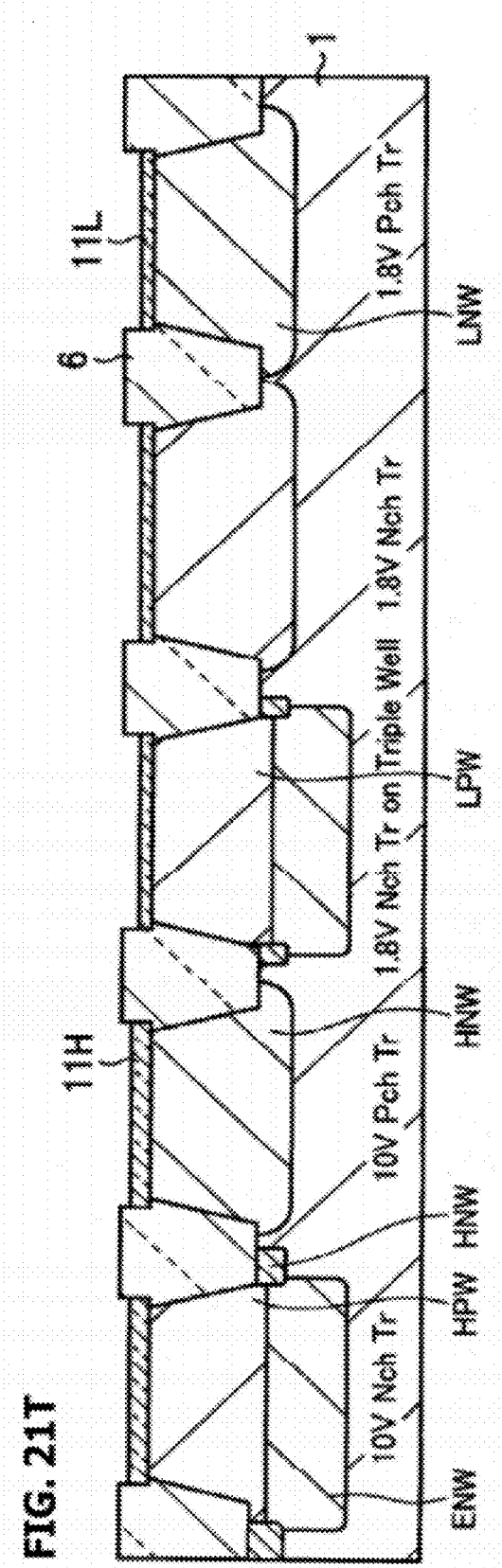

Refer to FIGS. 21M and 21T. By carrying out wet etching though resist pattern, the silicon oxide film 11 is removed in the low voltage transistor formation region (n-type 1.8 V triple-well transistor, n-type 1.8 V transistor, and p-type 1.8 V transistor) while being left in the high voltage transistor formation region (n-type 10 V transistor, and p-type 10 V transistor). The wet etching for removing the silicon oxide film 11 is carried out by, for instance, DHF treatment.

Then, for instance, a silicon oxide film (gate oxide film) 11L with a thickness of 3 nm is formed by thermal oxidation on the silicon substrate 1 in the low voltage transistor formation region. This thermal oxidation works to grow the silicon oxide film 11 in the high voltage transistor formation region and form the silicon oxide film (gate oxide film) 11H with a thickness of, for instance, 16 nm.

Refer to FIGS. 22M and 22T. For instance, polysilicon with a thickness of 100 nm is deposited by CVD to cover the ONO film 10 in the flash memory cell region and the gate oxide films 11H and 11L in the peripheral transistor region, to form an electrically conductive film 12 that will serve as the control gate electrode of the memory cell transistor and also as the gate electrode of the peripheral transistor. For instance, a nitride film with a thickness of 30 nm is deposited on the electrically conductive film 12 by CVD to form an antireflection film 13.

Figures 23M, 23T:
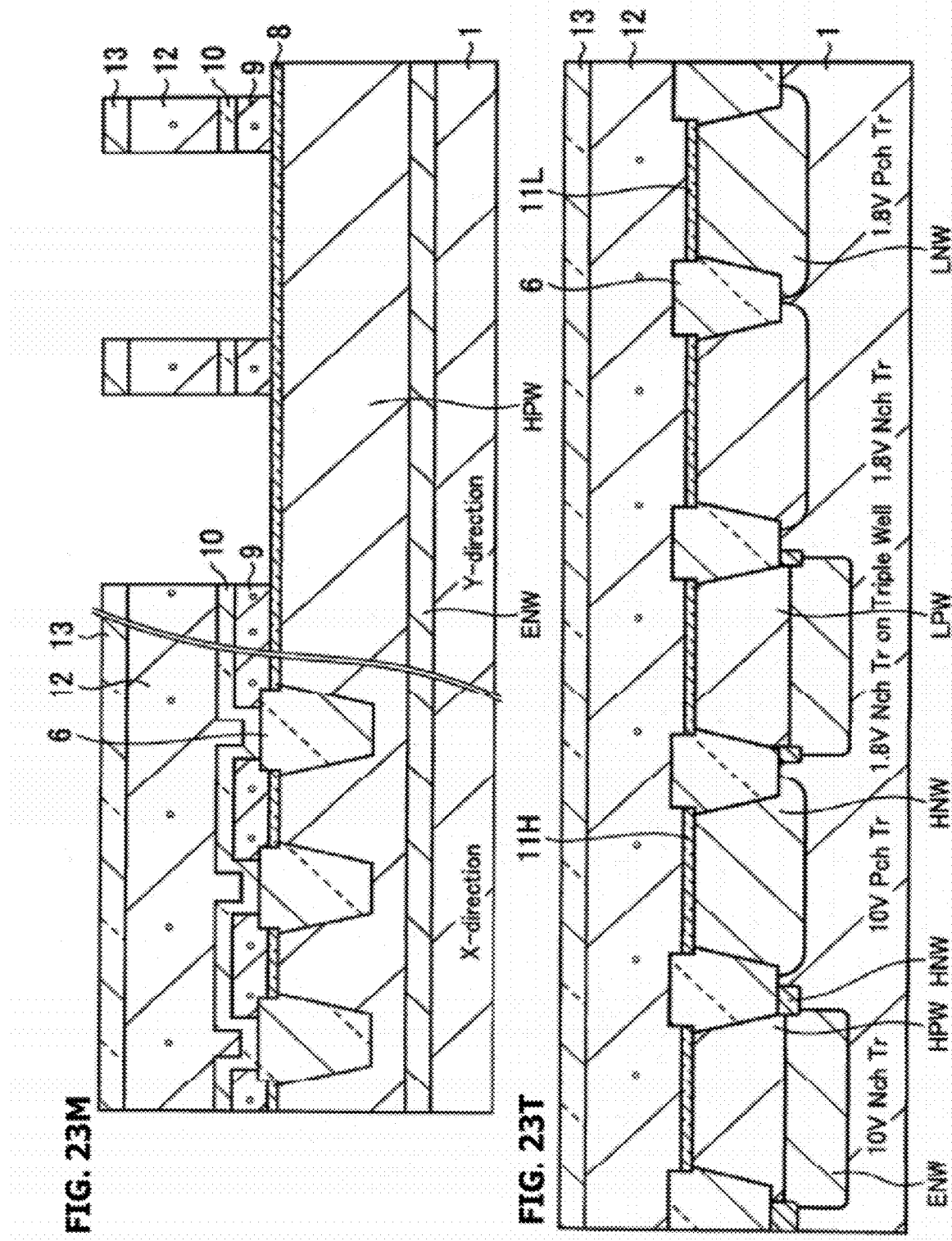

Refer to FIGS. 23M and 23T. By carrying out etching through resist pattern, the antireflection film 13, electrically conductive film 12, ONO film 10, and electrically conductive film 9 are patterned to form the gate electrode in the flash memory cell region.

Figures 24M, 24T:
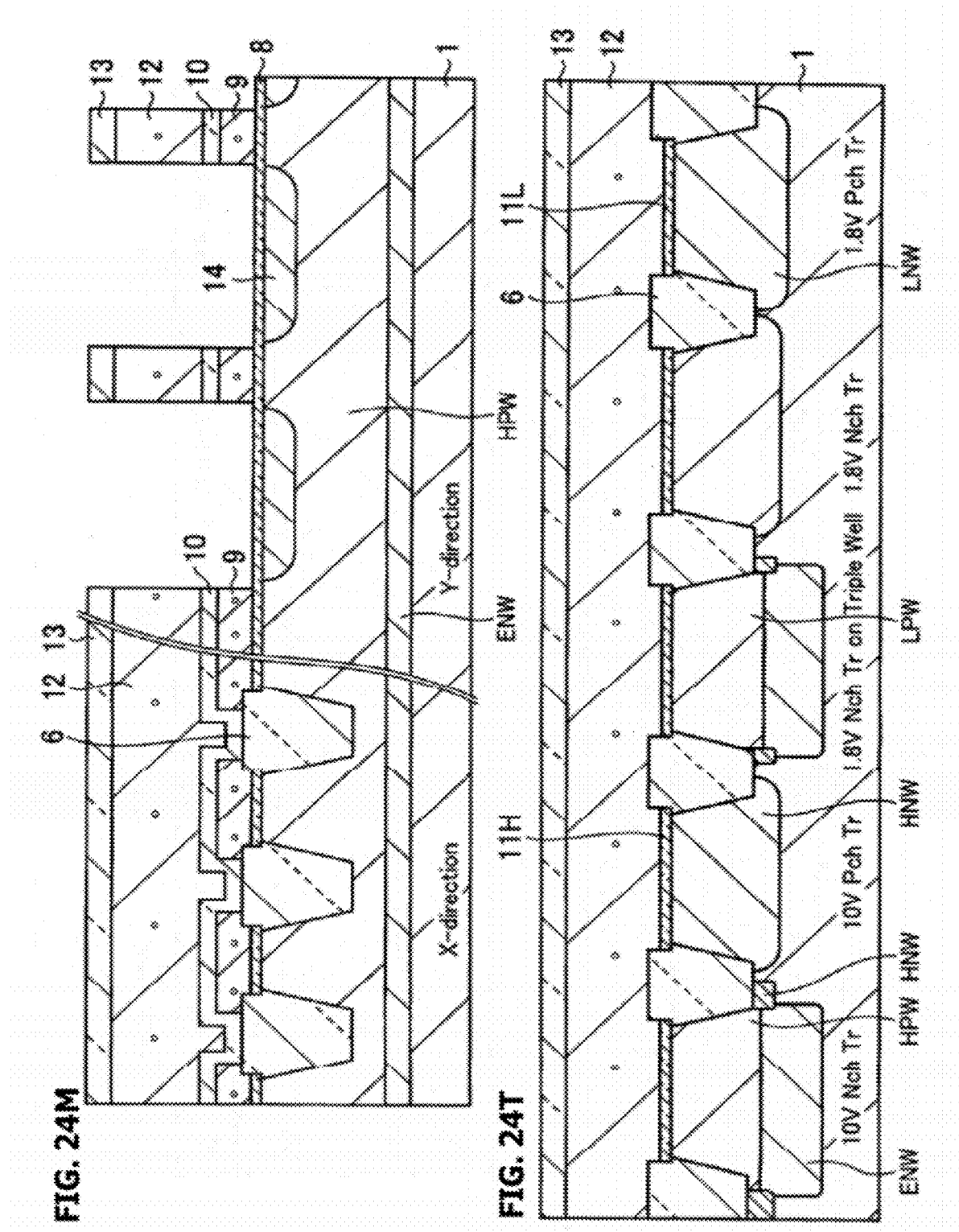

Refer to FIGS. 24M and 24T. Using the gate electrode as mask, n-type impurity is implanted in the flash memory cell region to form the source/drain region 14 of the flash memory cell transistor. Note that when p-type MOS transistor is used to form flash memory cell, the source/drain region is produced by implanting p-type impurity.

Refer to FIGS. 25M and 25T. The gate electrode's side walls in the flash memory cell region are subjected to thermal oxidation to form silicon oxide films 15. Subsequently, for instance, a silicon nitride film with a thickness of 50 nm is deposited on the entire face of the wafer by CVD. This silicon nitride film is etched anisotropically to form side wall insulation films 16 on the side walls of the gate electrode of the flash memory cell transistor. Here, this etching also removes the antireflection film 13.

Figure 26M:
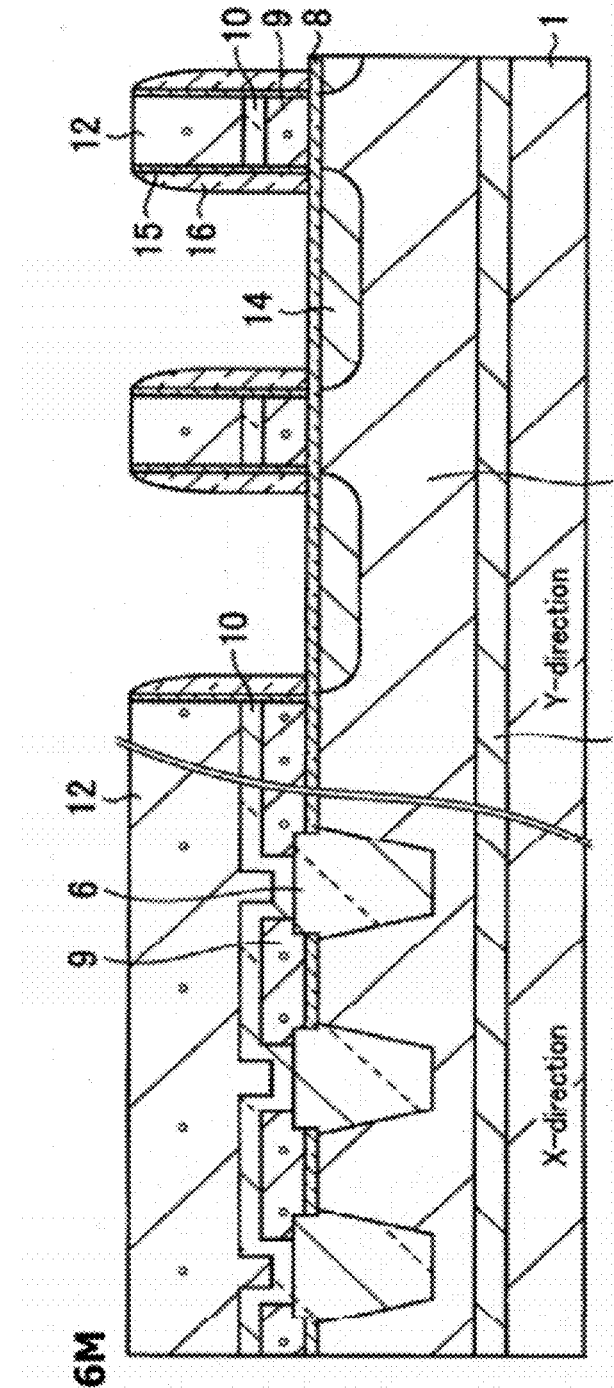
Figure 26T:
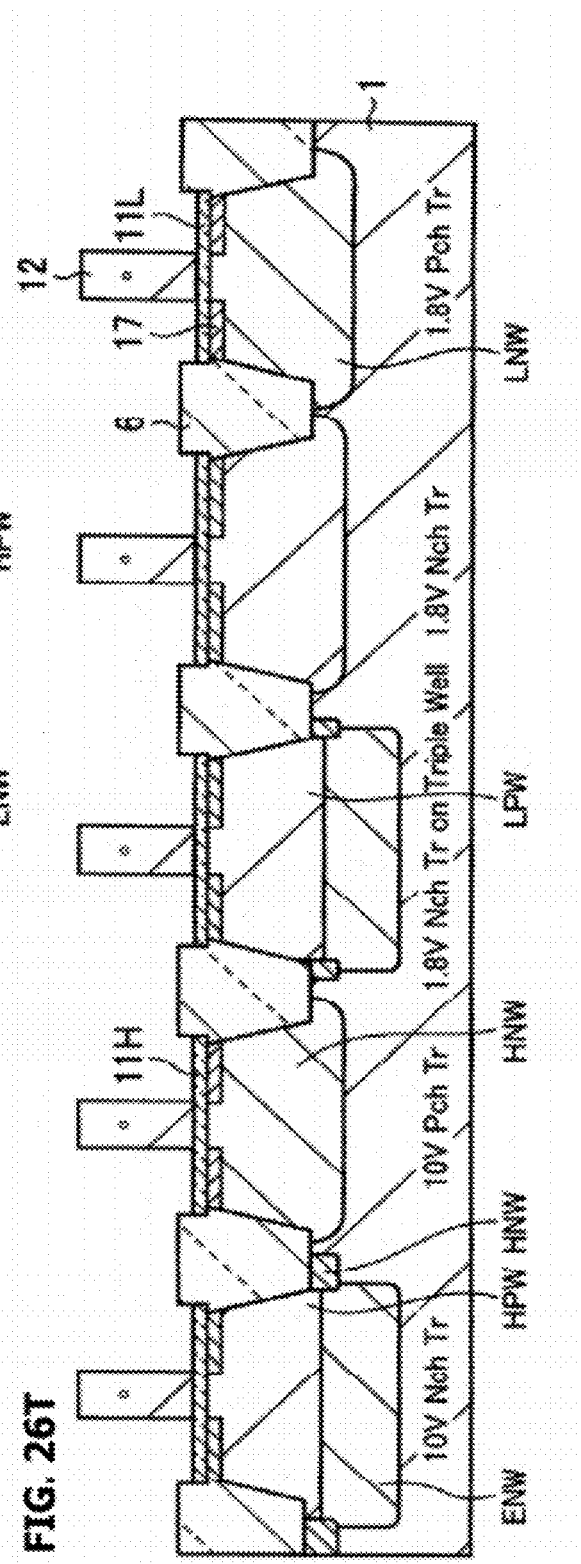

Refer to FIGS. 26M and 26T. The electrically conductive film 12 is patterned by etching through resist pattern to form gate electrode in the peripheral transistor region. Using resist pattern and the gate electrode of each transistor as mask, impurity for forming LDD region 17 is implanted in the peripheral transistor region.

Impurity of n-type is implanted in the n-type 10 V transistor region, the n-type 1.8 V triple-well transistor region, and the n-type 1.8 V transistor region. Impurity of p-type is implanted in the p-type 10 V transistor region and the p-type 1.8 V transistor region.

Figure 27M:
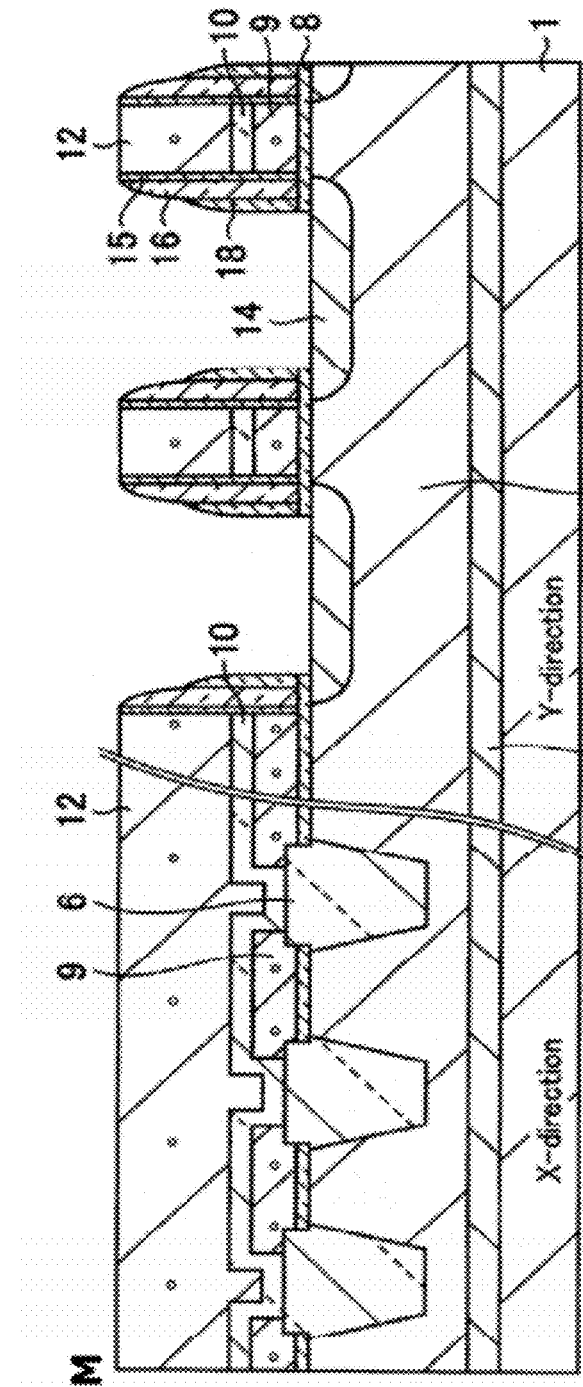
Figure 27T:
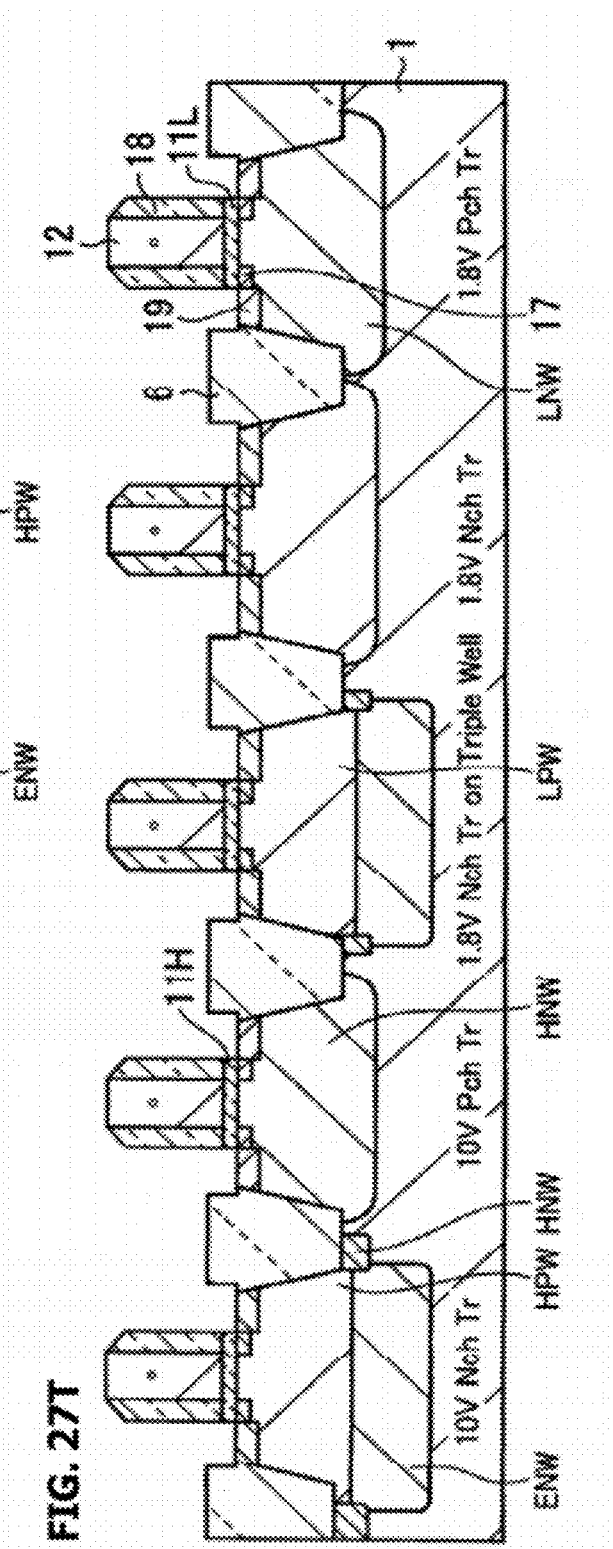

Refer to FIGS. 27M and 27T. For instance, a silicon oxide film with a thickness of 100 nm is deposited on the entire face of the wafer by CVD. This silicon oxide is etched anisotropically to form side wall insulation films 18 on the side walls of the gate electrode of the flash memory cell transistor and on the side walls of the gate electrode of the peripheral transistor. Note that this etching also removes the tunnel oxide film 8 outside the side wall insulation films 18 in the flash memory cell region and the gate oxide films 11H and 11L outside the side wall insulation films 18 in the peripheral transistor region.

Using resist pattern and the gate electrode 12 of each transistor, and the side wall insulation films as mask, impurity for forming source/drain regions 19 is implanted in the peripheral transistor region. Impurity of n-type is implanted in the n-type 10 V transistor region, the n-type 1.8 V triple-well transistor region, and the n-type 1.8 V transistor region. Impurity of p-type is implanted in the p-type 10 V transistor region and the p-type 1.8 V transistor region.

Figure 28M:
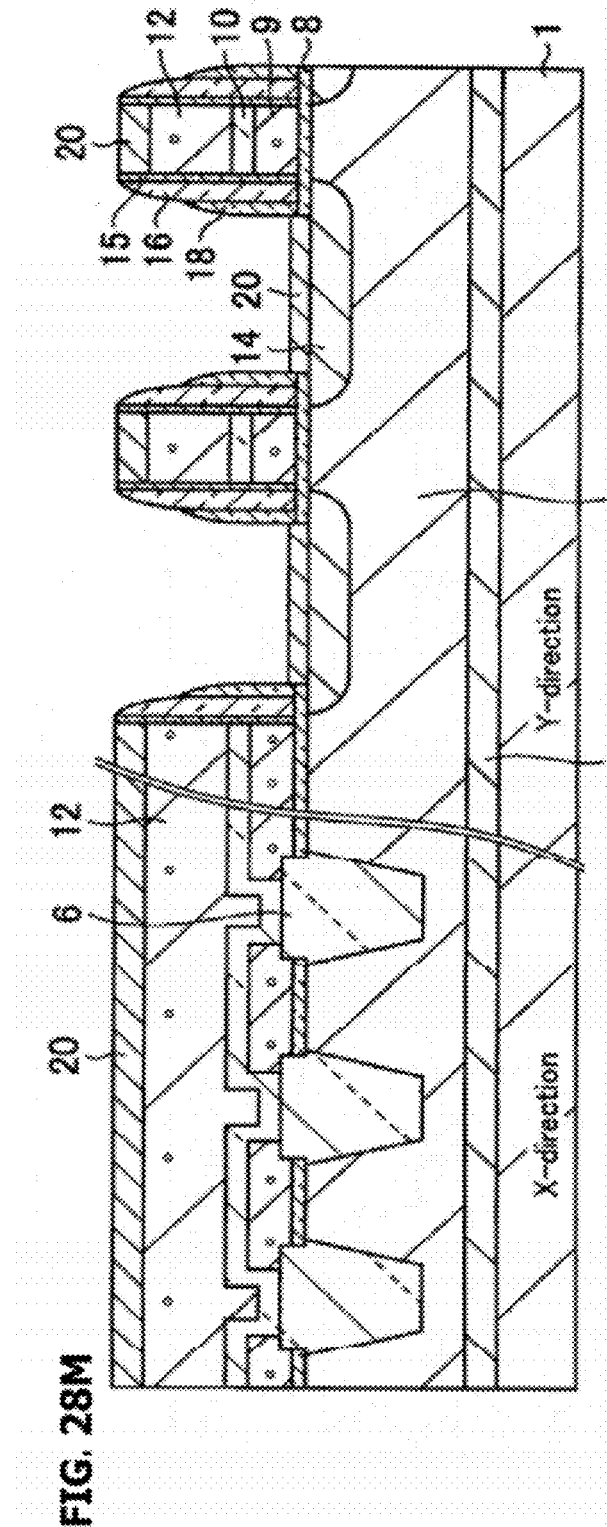
Figure 28T:
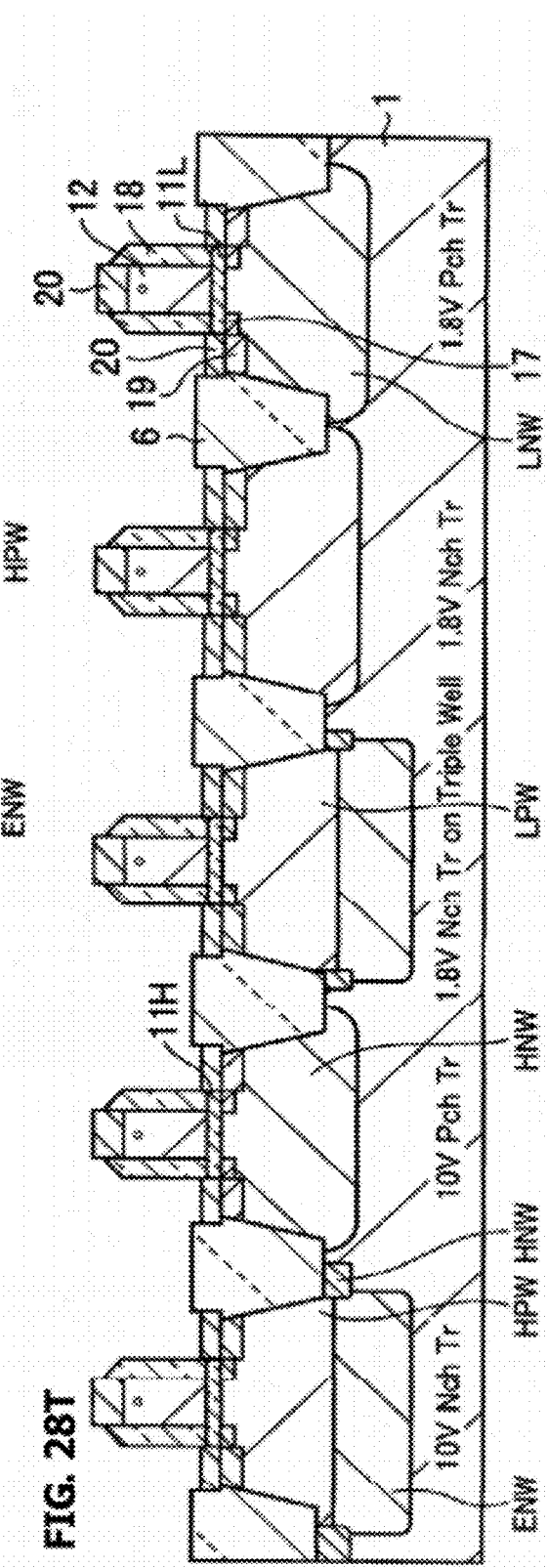

Refer to FIGS. 28M and 28T. In the flash memory cell region and the peripheral transistor region, a silicide layer 20 of, for instance, cobalt silicide is formed on the gate electrode 12 and the source/drain regions 14 and 19.

Refer to FIGS. 29M and 29T. For instance, a silicon nitride film with a thickness of 30 nm is deposited on the entire face of the wafer by CVD to form an etching stopper film 21. For instance, boron phosphorus silicate glass (BPSG) with a thickness of 1,600 nm is deposited on the etching stopper film 21 by CVD to form an interlayer insulation film 22.

Figure 30M:
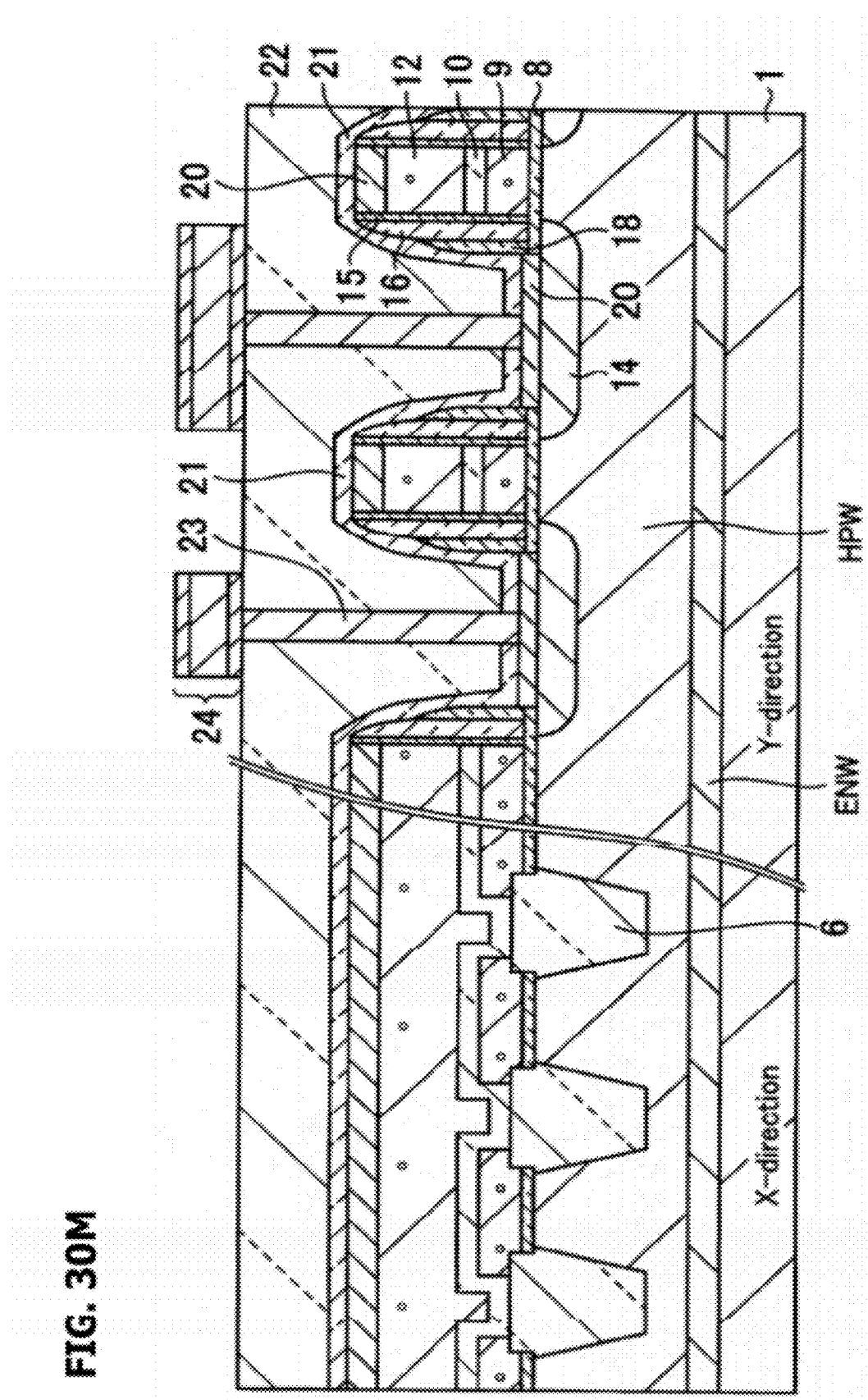
Figure 30T:
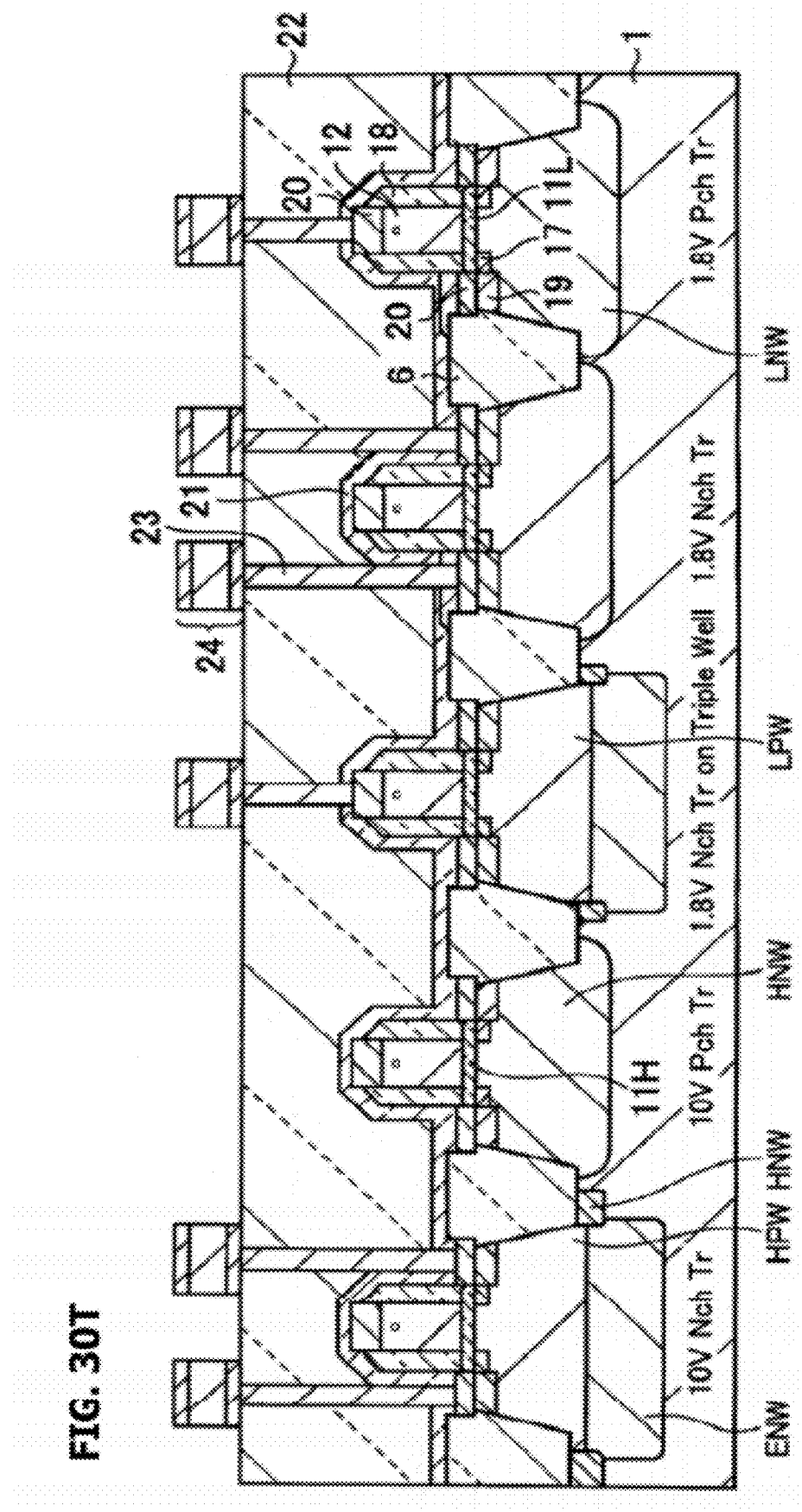

Refer to FIGS. 30M and 30T. The interlayer insulation film 22 and the etching stopper film 21 are etched through resist pattern to form contact holes that expose the silicide layer 20 arranged on the source/drain region 14 of the flash memory cell transistor and other contact holes that expose the silicide layer 20 arranged on the source/drain region 19 of the peripheral transistor. The etching stopper film 21 is used as etching stopper in the etching step for contact hole formation.

To cover the inner faces of the contact holes, for instance, a titanium film with a thickness of 30 nm is deposited on the interlayer insulation film 22 and then a titanium nitride film with a thickness of 20 nm is deposited on the titanium film, followed by forming a tungsten film with a thickness of 300 nm on the titanium nitride film. The unnecessary portions of the tungsten film, titanium nitride film, and titanium film on the interlayer insulation film 22 are removed by CMP to form an electrically conductive plug 23.

On the interlayer insulation film 22, for instance, an titanium film with a thickness of 60 nm is deposited, followed by depositing an titanium nitride film with a thickness of 30 nm on the titanium film, depositing an aluminum film with a thickness of 360 nm on this titanium nitride film, depositing an titanium film with a thickness of 5 nm on the aluminum film, and forming a titanium nitride film with a thickness of 70 nm on titanium film. This layered metal film is patterned by etching through resist pattern to form a first metal wiring 24.

Figure 31M:
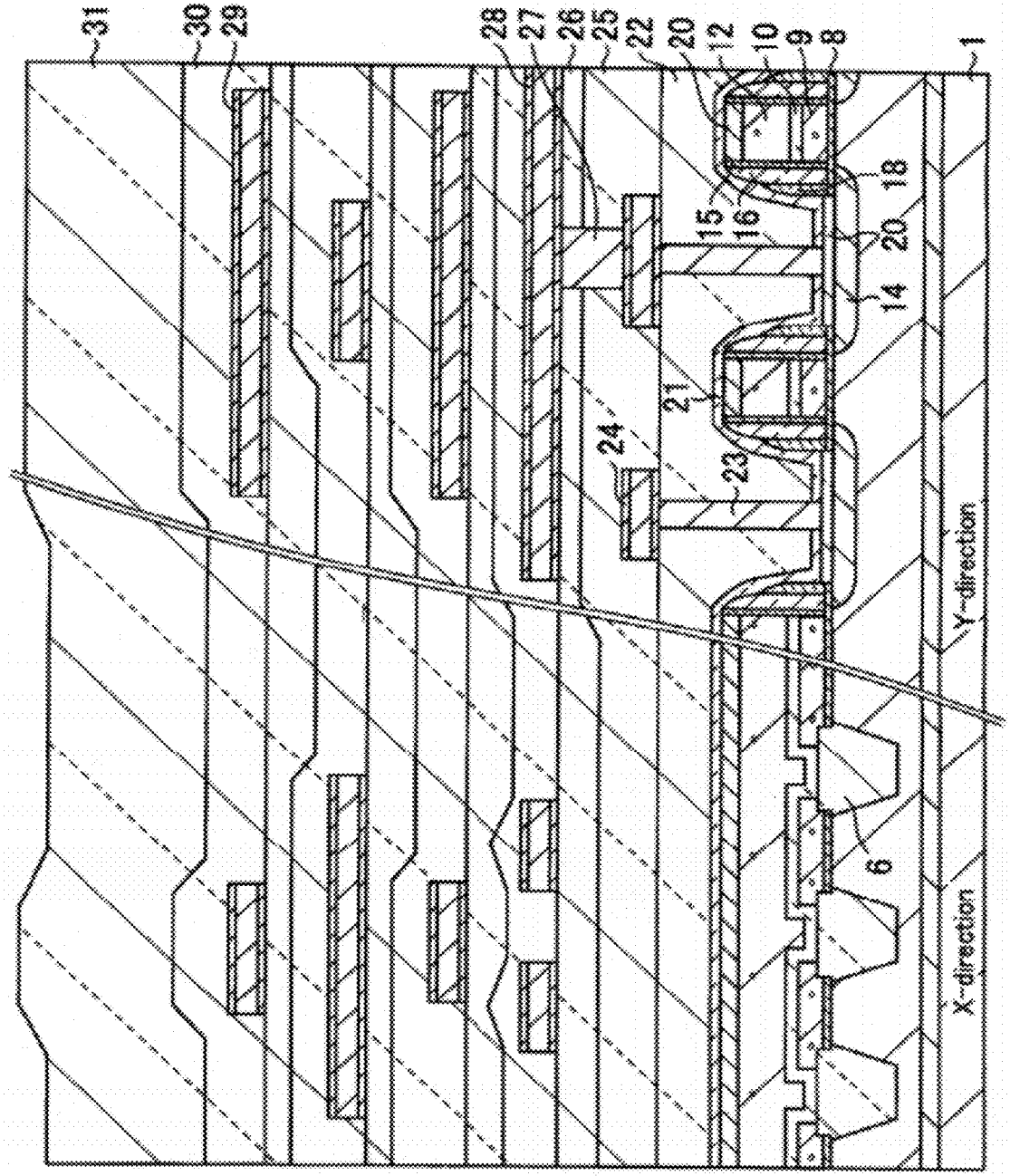
FIG. 31M is a schematic cross section illustrating a major step of a semiconductor device production process according to the application example.

Refer to FIG. 31M. An upper-layer wiring structure is formed next. The flash memory cell region is illustrated to represent the upper-layer wiring structure. To cover the first metal wiring 24, for instance, silicon oxide with a thickness of 720 nm is deposited on the interlayer insulation film 22 by HDPCVD to form an interlayer insulation film 25. On the interlayer insulation film 25, for instance, tetraethoxysilane (TEOS) with a thickness of 1,100 nm is deposited by CVD to form an interlayer insulation film 26. The top of the interlayer insulation film 26 is planarized by CMP.

Subsequently, the interlayer insulation films 26 and 25 are etched through resist pattern to form a contact hole that exposes the first metal wiring 24. To cover the inner faces of the contact holes, for instance, a titanium film with a thickness of 10 nm is deposited on the interlayer insulation film 26 and then a titanium nitride film with a thickness of 7 nm is deposited on the titanium film, followed by forming a tungsten film with a thickness of 300 nm on the titanium nitride film. The unnecessary portions of the tungsten film, titanium nitride film, and titanium film on the interlayer insulation film 26 are removed by CMP to form an electrically conductive plug 27. On the interlayer insulation film 26, a second metal wiring 28 is formed by the same procedure as for the first metal wiring 24.

Subsequently, the same procedures are repeated to form a multi-layered wiring structure. FIG. 31M gives an example where the wiring steps up to the formation of the fifth metal wiring 29 have been finished. On the fifth metal wiring 29, an interlayer insulation film 30 of silicon oxide is formed by HDPCVD and for instance, silicon nitride with a thickness of 1,000 nm is deposited on the interlayer insulation film 30 by CVD to form a protective insulation film 31. Thus, the semiconductor device according to the embodiment is completed.

As described above, in the semiconductor device production process according to the application example, APM treatment, DHF treatment, and HPM treatment are carried out sequentially to serve as pre-treatment for the subsequent thermal oxidation to round the corner of the isolation trench (see FIGS. 8A to 8C). In addition, APM treatment, DHF treatment, and HPM treatment are also carried out sequentially to serve as pre-treatment for the subsequent thermal oxidation to form the tunnel oxide film of the flash memory cell transistor (see FIGS. 15A and 15B). Applying the procedure according to the embodiment to the HPM treatment step that follows the DHF treatment step serves for preventing excessive etching of silicon and particularly for improved control of the shape of the corners of the isolation trenches.

Described below are improvements in electric characteristics of flash memory cell transistors brought about by applying the treatment procedure according to the embodiment. Flash memory cell transistor was prepared by the same procedure as for the application example. As an exception, however, the HPM treatment intended as pre-treatment for the thermal oxidation of the corners of the isolation trenches was performed by the same procedure as for the comparative example. The HPM treatment intended as pre-treatment for the thermal oxidation for tunnel oxide film formation was performed by the same procedure as for the embodiment. A sample thus prepared is referred to as "flash memory according to the embodiment".

Several wafers, each containing many flash memory cell transistors, were prepared. Flash memories were constructed of p-type MOS transistors. By changing the channel implantation conditions, samples were prepared under three different sets of channel conditions.

To provide a flash memory sample according to a comparative example, both the HPM treatment intended as pre-treatment for the thermal oxidation of the corners of the isolation trenches and the HPM treatment intended as pre-treatment for the thermal oxidation for tunnel oxide film formation were performed by the same procedure as for the comparative example.

This flash memory operates as described below. For writing, for instance, a gate voltage of 10 V, source voltage of 1.8 V, drain voltage of 0 V, and substrate voltage of 5 V are applied. This allows electrons undergoing interband transition in the intense electric field at the drain end to be accelerated in a depletion layer near the drain and implanted in the floating gate. Thus, the electrons from the drain are stored in the floating gate through band-to-band tunneling (BTBT). Despite p-type MOS transistor, electrons are stored in the floating gate. For erasing, for instance, a gate voltage of −15.5 V, source voltage of 0 V, drain voltage of 0 V, and substrate voltage of 0 V are applied so that the electrons stored in the floating gate are pulled out toward the substrate.

Figure 32:
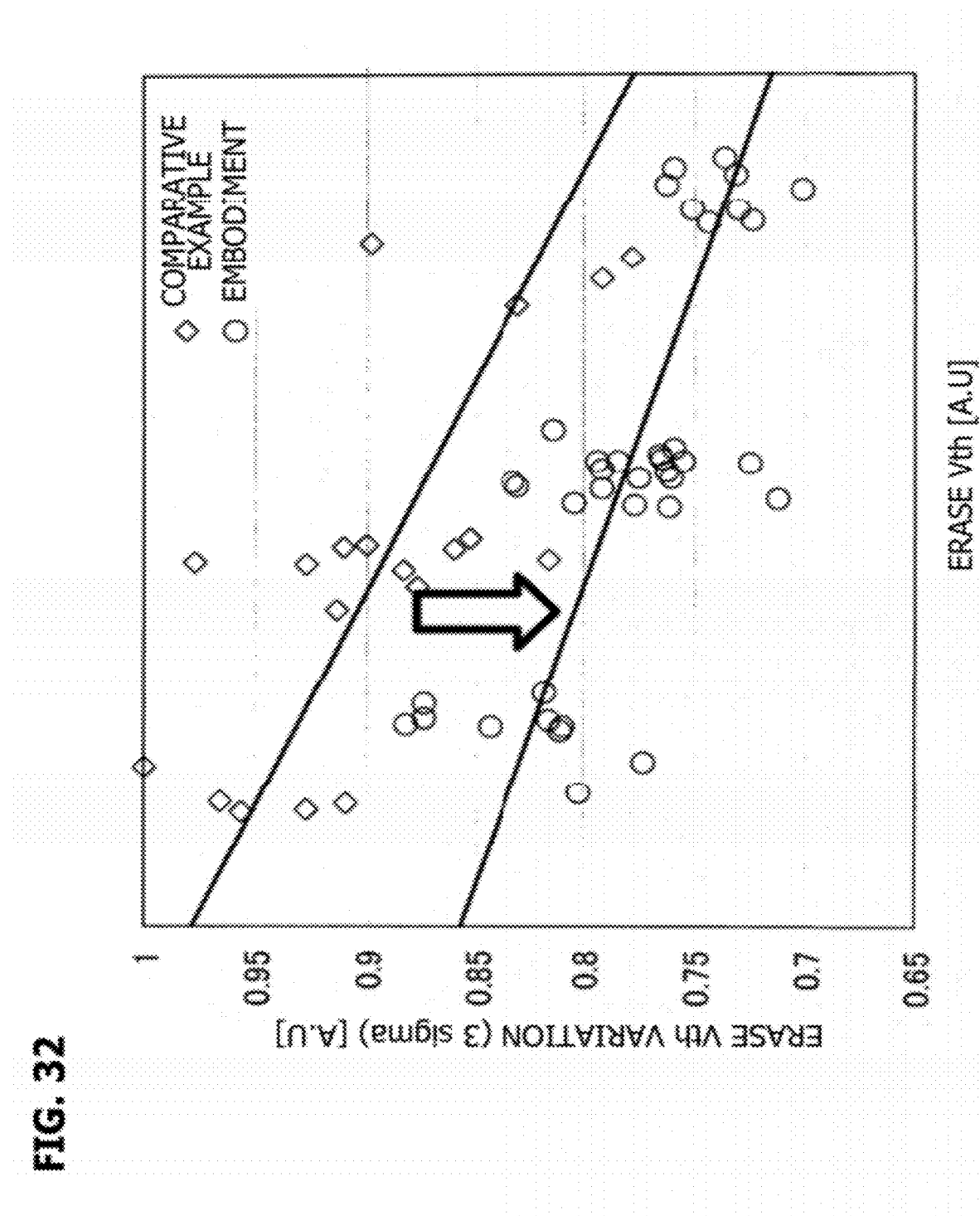
FIG. 32 gives a graph illustrating the threshold voltage and its variation for erased flash memory cell transistors of flash memories according to the embodiment and the comparative example.

FIG. 32 gives a graph for the threshold voltage (Erase Vth) and its variation in erased flash memory cell transistors of flash memories according to the embodiment and the comparative example. Each point corresponds to a wafer, and the horizontal and the vertical axis represent the Erase Vth averaged over the many flash memory cell transistors formed in each wafer, and its variance, respectively. Circles and rhombuses represent results for the embodiment and the comparative example, respectively.

The variance is smaller for the embodiment than for the comparative example. This means a smaller variation in Erase Vth among the several flash memories formed in a wafer. This decrease in variation in electric characteristics can be interpreted as resulting from the treatment according to the embodiment acting to improve the control of the shape of the corners of the isolation trenches, thereby leading to a decrease in variation in the shape of the corner among different flash memories.

Note that in the above treatment according to the embodiment, the introduction of HCl was started after the temperature of the treatment solution had reached the target temperature for the HPM treatment. The start of HCl supply may not be limited to a point after the treatment solution has reached the target temperature for the HPM treatment as long as HCl supply is started after the start of $H_2O_2$ supply. Here, the HCl starts to act as HPM treatment as soon as it is introduced, and it is preferable that the temperature of the treatment solution is raised to the target temperature for HPM treatment in order to enhance the treatment performance.

Figure 33:
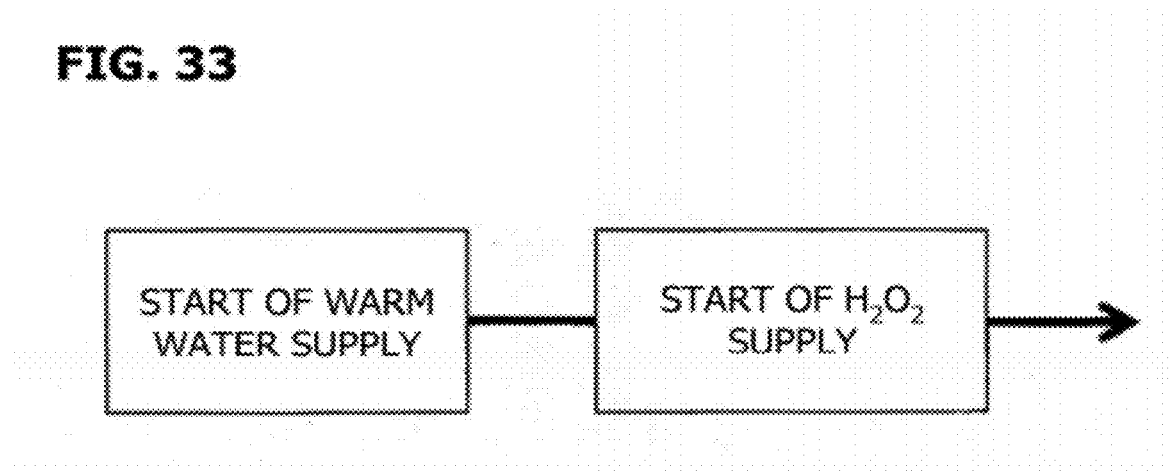
FIG. 33 gives a flow chart illustrating part of a treatment process according to another embodiment.

Here, warm water is introduced simultaneously with or subsequently to the supply of $H_2O_2$ in the treatment according to the above embodiment, but as described in FIG. 33, $H_2O_2$ may be introduced after the start of the supply of warm water as another embodiment. In this case, it is preferable that the supply of $H_2O_2$ is started before the water reaches a high temperature (for instance, 30° C. or more) where silicon is etched rapidly.

Calculations made for the embodiment indicate that the $H_2O_2$ concentration is 2.4 wt % at the time of reaching the target temperature and 1.2 wt % at 30° C. With respect to likely concentration limits, it is preferable, for instance, that the $H_2O_2$ concentration is 1.2 wt % or more, more preferably 2.4 wt % or more, before the water reaches a high temperature (for instance, 30° C. or more) where silicon is etched rapidly.

Note that in the treatment procedure according to the above embodiment, DHF treatment was followed by HPM treatment. Here, cases where DHF treatment is followed by APM treatment are described below. The APM treatment and HPM treatment commonly contain $H_2O_2$, and it can be assumed that $NH_4OH$ is used instead of the HCl used in HPM treatment.

As described for the HPM treatment according to the comparative example, the APM treatment where $H_2O_2$ and $NH_4OH$ are introduced after making warm water ready can allow the silicon to be etched by warm water. In the APM treatment as well, silicon etching by warm water can be depressed by introducing warm water simultaneously with or subsequently to the supply of $H_2O_2$.

The supply of $NH_4OH$ may be started, for instance, after the treatment solution has reached a target temperature for APM treatment, but as in the case of the HCl supply for HPM treatment, it is only required that its supply be started after the start of $H_2O_2$ supply. For APM treatment, furthermore, as described for HPM treatment, the supply of $H_2O_2$ may be started after the introduction of warm water.

Note that in the semiconductor device production process according to the above application example, APM treatment is performed first followed by DHF treatment and then HPM treatment as pre-treatment for thermal oxidation of the corners of the isolation trenches or as pre-treatment for thermal oxidation for tunnel oxide film formation. Such pre-treatment may be performed in the order of, for instance, DHF treatment performed first followed by APM treatment and then HPM treatment. In this case, DHF treatment is followed by APM treatment.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device production method comprising:
   treating a wafer that includes a silicon substrate with dilute hydrofluoric acid in a bath;
   introducing first water into the bath and discharging the dilute hydrofluoric acid from the bath; and
   introducing $H_2O_2$ and second water warmer than the first water into the bath after the discharge of dilute hydrofluoric acid from the bath in such a manner that the introduction of the second water is started simultaneously with the start of $H_2O_2$ supply or subsequently to the start of $H_2O_2$ supply.

2. The semiconductor device production method according to claim 1, further comprising introducing HCl or $NH_4OH$ into the bath after the introducing $H_2O_2$.

3. The semiconductor device production method according to claim 2, wherein HCL or $NH_4OH$ is introduced after temperature in the bath has reached a target temperature.

4. The semiconductor device production method according to claim 3, wherein the target temperature is in a range of 60° C. to 80° C. and HCl is introduced into the bath.

5. The semiconductor device production method according to claim 3, wherein the target temperature is in a range of 40° C. to 80° C. and $NH_4OH$ is introduced into the bath.

6. The semiconductor device production method according to claim 1, wherein temperature of the first water is in a range of 24° C. to 26° C.

7. The semiconductor device production method according to claim 1, wherein dissolved oxygen concentration in the water and that in the second water are 80 ppb or less.

8. The semiconductor device production method according to claim 1, further comprising, before the treatment with dilute hydrofluoric acid, forming a silicon oxide film on the silicon substrate, forming a mask pattern defining an opening on the silicon oxide film, and etching the silicon oxide film and the silicon substrate in the opening to form an isolation trench in the silicon substrate.

9. The semiconductor device production method according to claim 8, wherein the treatment with dilute hydrofluoric acid shifts the end of the silicon oxide film backward,
   and further comprising, after the backward shift of the end of the silicon oxide film, a silicon oxide film is grown on the inner wall of the isolation trench by thermal oxidation.

10. The semiconductor device production method according to claim 1, further comprising, before the treatment with dilute hydrofluoric acid, forming an isolation trench in the silicon substrate, buried silicon oxide film in the isolation trench, and forming a silicon oxide film on the silicon substrate outside the isolation trench.

11. The semiconductor device production method according to claim 10, further comprising, before the treatment with dilute hydrofluoric acid, implanting impurity in the silicon substrate through the silicon oxide film on the silicon substrate outside the isolation trench.

12. The semiconductor device production method according to claim 10, wherein the treatment with dilute hydrofluoric acid removes the silicon oxide film on the silicon substrate outside the isolation trench,
   and further comprising, after the removal of the silicon oxide film on the silicon substrate outside the isolation trench, growing a silicon oxide film on the silicon substrate by thermal oxidation.

13. A semiconductor device production method comprising:
   treating a wafer that includes a silicon substrate with dilute hydrofluoric acid treatment in a bath;
   introducing first water into the bath and discharging the dilute hydrofluoric acid from the bath; and
   introducing second water warmer than the first water into the bath after the discharge of the dilute hydrofluoric acid from the bath, and introducing $H_2O_2$ into the bath before temperature in the bath reaches 30° C.

14. The semiconductor device production method according to claim 13, wherein the introducing $H_2O_2$ into the bath before temperature in the bath reaches 30° C. is implemented in such a manner that the introducing second water is started simultaneously with the introducing $H_2O_2$ or subsequently to the introducing $H_2O_2$.

15. The semiconductor device production method according to claim 13, wherein the introducing $H_2O_2$ into the bath before temperature in the bath reaches 30° C. is implemented in such a manner that the introducing second water is started prior to the introducing $H_2O_2$.

16. The semiconductor device production method according to claim 13, further comprising introducing HCl or $NH_4OH$ into the bath after the introducing $H_2O_2$.

17. The semiconductor device production method according to claim 13, wherein temperature of the first water is in a range of 24° C. to 26° C.

* * * * *